United States Patent
Ohkoshi et al.

(10) Patent No.: US 11,482,437 B2
(45) Date of Patent: Oct. 25, 2022

(54) SUPPORT, ADHESIVE SHEET, LAMINATED STRUCTURE, SEMICONDUCTOR DEVICE, AND METHOD FOR MANUFACTURING PRINTED WIRING BOARD

(71) Applicant: Ajinomoto Co., Inc., Tokyo (JP)

(72) Inventors: Masanori Ohkoshi, Kawasaki (JP); Hirohisa Narahashi, Kawasaki (JP); Eiichi Hayashi, Kawasaki (JP)

(73) Assignee: Ajinomoto Co., Inc., Tokyo (JP)

( * ) Notice: Subject to any disclaimer, the term of this patent is extended or adjusted under 35 U.S.C. 154(b) by 400 days.

(21) Appl. No.: 16/824,106

(22) Filed: Mar. 19, 2020

(65) Prior Publication Data

US 2020/0219750 A1    Jul. 9, 2020

Related U.S. Application Data

(60) Division of application No. 15/485,603, filed on Apr. 12, 2017, now Pat. No. 11,121,020, which is a
(Continued)

(30) Foreign Application Priority Data

Oct. 16, 2014   (JP) .................................. 2014-212065

(51) Int. Cl.
*B32B 7/06* (2019.01)
*H01L 21/683* (2006.01)
(Continued)

(52) U.S. Cl.
CPC .......... *H01L 21/6835* (2013.01); *B32B 37/06* (2013.01); *B32B 37/12* (2013.01);
(Continued)

(58) Field of Classification Search
CPC ............... H01L 23/145; H01L 21/6835; H01L 21/4846; H01L 2221/68345;
(Continued)

(56) References Cited

U.S. PATENT DOCUMENTS

| 5,885,501 A | 3/1999 | Gardner et al. |
| 6,739,040 B1 * | 5/2004 | Nakamura ........... H05K 3/4069 29/830 |

(Continued)

FOREIGN PATENT DOCUMENTS

| JP | 2003-243826 | 8/2003 |
| JP | 2005-154727 A | 6/2005 |

(Continued)

OTHER PUBLICATIONS

Combined Taiwanese Office Action and Search Report dated Dec. 23, 2020 in Patent Application No. 104120744 (with English Translation of Category of Cited Documents), 9 pages.

(Continued)

*Primary Examiner* — Luan C Thai
(74) *Attorney, Agent, or Firm* — Oblon, McClelland, Maier & Neustadt, L.L.P.

(57) ABSTRACT

A method for manufacturing a printed wiring board which includes: Step (A) of laminating an adhesive sheet including a support and a resin composition layer bonded to the support to an inner layer board so that the resin composition layer is bonded to the inner layer board; Step (B) of thermally curing the resin composition layer to form an insulating layer; and Step (C) of removing the support, in this order, in which the support satisfies a condition (MD1): a maximum expansion coefficient $E_{MD}$ in an MD direction at 120° C. or more is less than 0.2% and a condition (TD1): a maximum expansion coefficient $E_{TD}$ in a TD direction at 120° C. or more is less than 0.2% below, when being heated (Continued)

under predetermined heating conditions, does not lower the yield even when the insulating layer is formed by thermally curing the resin composition layer with a support attached to the resin composition layer.

6 Claims, 4 Drawing Sheets

Related U.S. Application Data continuation of application No. PCT/JP2015/067087, filed on Jun. 12, 2015.

(51) Int. Cl.
| | |
|---|---|
| *H05K 3/46* | (2006.01) |
| *H05K 3/00* | (2006.01) |
| *B32B 37/06* | (2006.01) |
| *B32B 37/12* | (2006.01) |
| *H01L 21/48* | (2006.01) |
| *H01L 23/14* | (2006.01) |

(52) U.S. Cl.
CPC ........ *H01L 21/4846* (2013.01); *H01L 23/145* (2013.01); *H05K 3/0058* (2013.01); *H05K 3/46* (2013.01); *H05K 3/4644* (2013.01); *B32B 2309/025* (2013.01); *B32B 2457/08* (2013.01); *H01L 2221/68304* (2013.01); *H01L 2221/68345* (2013.01)

(58) Field of Classification Search
CPC ...... H05K 3/0058; H05K 3/46; H05K 3/4644; B32B 37/06; B32B 37/12; B32B 2309/025; B32B 2457/08
USPC ....................................................... 156/247
See application file for complete search history.

(56) References Cited

U.S. PATENT DOCUMENTS

| | | | |
|---|---|---|---|
| 9,050,780 B2* | 6/2015 | Aoshima | ........... B32B 17/10871 |
| 9,101,061 B2* | 8/2015 | Aoshima | ................ H05K 1/036 |
| 2005/0008868 A1 | 1/2005 | Nakamura et al. | |
| 2015/0250052 A1 | 9/2015 | Ohkoshi et al. | |

FOREIGN PATENT DOCUMENTS

| | | |
|---|---|---|
| JP | 2008-189711 A | 8/2008 |
| JP | 2010-028036 | 2/2010 |
| JP | 2011-236428 A | 11/2011 |
| JP | 2012-195528 A | 10/2012 |
| JP | 2013-4915 A | 1/2013 |
| JP | 2013-26456 A | 2/2013 |
| JP | 2014-007403 | 1/2014 |
| TW | 200504146 | 2/2005 |
| TW | I655889 B | 4/2019 |

OTHER PUBLICATIONS

Combined Taiwanese Office Action and Search Report dated Dec. 23, 2020 in Patent Application No. 108136589 (with English translation of Category of Cited Documents), 10 pages.
Notification of Reason for Refusal dated Jun. 1, 2021 in Korean Patent Application No. 10-2017-7012954 (with English machine translation), 9 pages.
Combined Chinese Office Action and Search Report dated Aug. 15, 2018 in Chinese Patent Application No. 201580055177.4 (with unedited computer generated English translation), 11 pages.
Office Action dated Nov. 27, 2018 in Japanese Patent Application No. 2016-028925, 9 pages (with English translation).
Office Action and Search Report dated Feb. 15, 2019 in the corresponding Taiwanese Patent Application No. 104120744 with Translation of Category of Cited Document 7 pages.
International Search Report in Application No. PCT/JP2015/067087 dated Sep. 8, 2015.

* cited by examiner

SUPPORT, ADHESIVE SHEET, LAMINATED STRUCTURE, SEMICONDUCTOR DEVICE, AND METHOD FOR MANUFACTURING PRINTED WIRING BOARD

CROSS REFERENCES TO RELATED APPLICATIONS

This application is a divisional application of U.S. patent application Ser. No. 15/485,603, filed on Apr. 12, 2017, which was a continuation of International Patent Application No. PCT/JP2015/067087, filed on Jun. 12, 2015, and claims priority to Japanese Patent Application No. 2014-212065, filed on Oct. 16, 2014, both of which are incorporated herein by reference in their entireties.

BACKGROUND OF THE INVENTION

Field of the Invention

The present invention relates to methods for manufacturing a printed wiring board. The present invention also relates to adhesive sheets, supports, and laminated structures to be used in such a method, and semiconductor devices comprising the printed wiring board produced by such a manufacturing method.

Discussion of the Background

As a method for manufacturing a printed wiring board, a method for manufacturing a printed wiring board by a buildup method in which an insulating layer and a conductor layer are alternately stacked has been known. In the method for manufacturing a printed wiring board by the buildup method, generally, the insulating layer is formed by thermally curing a resin composition. In a multilayer printed wiring board, a plurality of buildup layers formed by the buildup method are comprised, and the wiring is required to have a finer structure and a higher density.

For example, Japanese Patent Application Laid-open No. 2014-7403, which is incorporated herein by reference in its entirety, discloses a step of laminating a support-attached resin composition layer (hereinafter referred to as an adhesive sheet) on an inner layer board, then thermally curing the resin composition layer, and thereafter peeling off the support.

There remains, however, a need for improved methods for manufacturing printed wiring boards.

SUMMARY OF THE INVENTION

Accordingly, it is one object of the present invention to provide novel methods for manufacturing a printed wiring board.

It is another object of the present invention to provide novel adhesive sheets to be used in such a method.

It is another object of the present invention to provide novel supports to be used in such a method.

It is another object of the present invention to provide novel laminated structures to be used in such a method.

It is another object of the present invention to provide novel semiconductor devices which contain a printed wiring board produced by such a method.

These and other objects, which will become apparent during the following detailed description, have been achieved by the inventors' discovery of the following problems. In a method for manufacturing a printed wiring board by bonding an adhesive sheet to an inner layer board and peeling off the support after thermal curing, the support expands in the thermal curing step, whereby the resin composition is pushed by the support in the vicinity of the edge part of the support to run on the support or to generate a raised part where the resin composition is raised to such an extent that the raised part exceeds the thickness of the support. Consequently, the flatness of the insulating layer formed in a step for bonding further the adhesive sheet in a subsequent buildup step is impaired, and winkles and lifting of the support are caused to lower the yield of the printed wiring board to be manufactured. Or in the step of peeling off the support, the raised part is dropped out to be separated and further to adhere to the insulating layer (this phenomenon is referred to as "resin chip adhesion") so as to lower the yield of the printed wiring board to be manufactured.

Therefore, one object of the present invention is to provide a method for manufacturing a printed wiring board that does not lower the yield even when the insulating layer is formed by thermally curing the resin composition layer with the support attached to the resin composition layer, and to provide an adhesive sheet, a support, and a laminated structure to be used in such a method.

As a result of intensive study to solve the aforementioned problems, the inventors of the present invention have found that the problems can be solved by using an adhesive sheet comprising a support exhibiting predetermined expansion properties at the time of thermal curing of the resin composition layer.

Thus, the present invention provides"

(1) A support satisfying a condition (MD1) and a condition (TD1) below when being heated under heating conditions below:

Heating conditions: temperature is raised from 20° C. to 100° C. at a rate of temperature rise of 8° C./min and heating is carried out at 100° C. for 30 minutes, and thereafter the temperature is raised to 180° C. at a rate of temperature rise of 8° C./min and heating is carried out at 180° C. for 30 minutes, Condition (MD1): a maximum expansion coefficient $E_{MD}$ (%) in an MD direction at 120° C. or more is less than 0.2%, and Condition (TD1): a maximum expansion coefficient $E_{TD}$ (%) in a TD direction at 120° C. or more is less than 0.2%.

(2) The support according to (1), wherein the support satisfies a condition (MD2) and a condition (TD2):

Condition (MD2): the maximum expansion coefficient $E_{MD}$ (%) in the MD direction at 100° C. or more is less than 0%, and Condition (TD2): the maximum expansion coefficient $E_{TD}$ (%) in the TD direction at 100° C. or more is less than 0%.

(3) A support satisfying a condition (MD3) and a condition (TD3) below when being heated under heating conditions below:

Heating conditions: temperature is raised from 20° C. to 100° C. at a rate of temperature rise of 8° C./min and heating is carried out at 100° C. for 30 minutes, and thereafter the temperature is raised to 180° C. at a rate of temperature rise of 8° C./min and heating is carried out at 180° C. for 30 minutes, Condition (MD3): a temperature at which an expansion coefficient in an MD direction becomes maximum is less than 120° C., and Condition (TD3): a temperature at which an expansion coefficient in a TD direction becomes maximum is less than 120° C.

(4) A support satisfying a condition (MD4) and a condition (TD4) below:

Condition (MD4): a temperature at which an expansion coefficient of the support in an MD direction becomes maximum is less than 120° C., and Condition (TD4): a temperature at which an expansion coefficient of the support in a TD direction becomes maximum is less than 120° C.

(5) An adhesive sheet comprising:

a support satisfying a condition (MD1) and a condition (TD1) below when being heated under heating conditions below:

Heating conditions: temperature is raised from 20° C. to 100° C. at a rate of temperature rise of 8° C./min and heating is carried out at 100° C. for 30 minutes, and thereafter the temperature is raised to 180° C. at a rate of temperature rise of 8° C./min and heating is carried out at 180° C. for 30 minutes, Condition (MD1): a maximum expansion coefficient $E_{MD}$ (%) in an MD direction at 120° C. or more is less than 0.2%, and Condition (TD1): a maximum expansion coefficient $E_{TD}$ (%) in a TD direction at 120° C. or more is less than 0.2%; and a resin composition layer bonded to the support.

(6) The adhesive sheet according to (5), wherein the support satisfies a condition (MD2) and a condition (TD2) below:

Condition (MD2): the maximum expansion coefficient $E_{MD}$ (%) in the MD direction at 100° C. or more is less than 0%, and Condition (TD2): the maximum expansion coefficient $E_{TD}$ (%) in the TD direction at 100° C. or more is less than 0%.

(7) An adhesive sheet comprising:

a support satisfying a condition (MD3) and a condition (TD3) below when being heated under the following heating conditions:

Heating conditions: temperature is raised from 20° C. to 100° C. at a rate of temperature rise of 8° C./min and heating is carried out at 100° C. for 30 minutes, and thereafter the temperature is raised to 180° C. at a rate of temperature rise of 8° C./min and heating is carried out at 180° C. for 30 minutes, Condition (MD3): a temperature at which an expansion coefficient in an MD direction becomes maximum is less than 120° C., and Condition (TD3): a temperature at which an expansion coefficient in a TD direction becomes maximum is less than 120° C.; and a resin composition layer bonded to the support.

(8) An adhesive sheet comprising:

a support satisfying a condition (MD4) and a condition (TD4) below:

Condition (MD4): a temperature at which an expansion coefficient of the support in an MD direction becomes maximum is less than 120° C., and Condition (TD4): a temperature at which an expansion coefficient of the support in a TD direction becomes maximum is less than 120° C.; and a resin composition layer bonded to the support.

(9) A method for manufacturing a printed wiring board, comprising:

Step (A) of laminating an adhesive sheet comprising a support and a resin composition layer bonded to the support to an inner layer board so that the resin composition layer is bonded to the inner layer board;

Step (B) of thermally curing the resin composition layer to form an insulating layer; and Step (C) of removing the support, in this order, wherein the support satisfies a condition (MD1) and a condition (TD1) below when being heated under heating conditions below:

Heating conditions: temperature is raised from 20° C. to 100° C. at a rate of temperature rise of 8° C./min and heating is carried out at 100° C. for 30 minutes, and thereafter the temperature is raised to 180° C. at a rate of temperature rise of 8° C./min and heating is carried out at 180° C. for 30 minutes, Condition (MD1): a maximum expansion coefficient $E_{MD}$ (%) in an MD direction at 120° C. or more is less than 0.2%, and Condition (TD1): a maximum expansion coefficient $E_{TD}$ (%) in a TD direction at 120° C. or more is less than 0.2%.

(10) The method for manufacturing a printed wiring board according to (9), wherein the support satisfies a condition (MD2) and a condition (TD2) below:

Condition (MD2): the maximum expansion coefficient $E_{MD}$ (%) in the MD direction at 100° C. or more is less than 0%, and Condition (TD2): the maximum expansion coefficient $E_{TD}$ (%) in the TD direction at 100° C. or more is less than 0%.

(11) A method for manufacturing a printed wiring board, comprising:

Step (A) of laminating an adhesive sheet comprising a support and a resin composition layer bonded to the support to an inner layer board so that the resin composition layer is bonded to the inner layer board;

Step (B) of thermally curing the resin composition layer to form an insulating layer; and Step (C) of removing the support, in this order, wherein the support satisfies a condition (MD3) and a condition (TD3) below when being heated under heating conditions below:

Heating conditions: temperature is raised from 20° C. to 100° C. at a rate of temperature rise of 8° C./min and heating is carried out at 100° C. for 30 minutes, and thereafter the temperature is raised to 180° C. at a rate of temperature rise of 8° C./min and heating is carried out at 180° C. for 30 minutes, Condition (MD3): a temperature at which an expansion coefficient in an MD direction becomes maximum is less than 120° C., and Condition (TD3): a temperature at which an expansion coefficient in a TD direction becomes maximum is less than 120° C.,

(12) A method for manufacturing a printed wiring board, comprising:

Step (A) of laminating an adhesive sheet comprising a support and a resin composition layer bonded to the support to an inner layer board so that the resin composition layer is bonded to the inner layer board;

Step (B) of thermally curing the resin composition layer to form an insulating layer; and Step (C) of removing the support, in this order, wherein in Step (B), a condition (MD4) and a condition (TD4) below are satisfied:

Condition (MD4): a temperature at which an expansion coefficient of the support in an MD direction becomes maximum is less than 120° C., and Condition (TD4): a temperature at which an expansion coefficient of the support in a TD direction becomes maximum is less than 120° C.

(13) The method for manufacturing a printed wiring board according to any one of (9) to (12), wherein Step (B) comprises:

(i) a step of heating the resin composition layer at a temperature $T_1$ (50° C.≤$T_1$<150° C.) and;

(ii) a step of thermally curing the resin composition layer at a temperature $T_2$ (150° C.≤$T_2$≤240° C.) after the step of heating.

(14) The method for manufacturing a printed wiring board according to any one of (9) to (11), wherein under the heating conditions, a minimum melt viscosity of the resin composition layer when the expansion coefficient of the support in the TD direction is 0(%) or less is 10,000 poise or less, and a minimum melt viscosity of the resin composition layer when the expansion coefficient of the support in the MD direction is 0(%) or less is 10,000 poise or less.

(15) A semiconductor device comprising the printed wiring board manufactured by the method for manufacturing a printed wiring board according to any one of (9) to (14).

(16) A laminated structure comprising:

an inner layer board;

an insulating layer provided on the inner layer board; and a support bonded to the insulating layer, wherein when a thickness of a central part of the insulating layer is determined to be t (μm), a thickness of the insulating layer comprising a raised part outside the central part is 2.5t (μm) or less.

(17) The laminated structure according to (16), wherein the thickness t satisfies t≤40.

(18) A laminated structure comprising:

an inner layer board;

an insulating layer provided on the inner layer board; and a support bonded to the insulating layer, wherein a highest point of a raised part of the insulating layer to which the support is bonded is at a position lower than a height of a surface of the support.

(19) A laminated structure comprising:

an inner layer board;

an insulating layer provided on the inner layer board; and a support bonded to the insulating layer, wherein a difference in height between a lowest point and a highest point is 60 μm or less, where at the lowest point a height of the insulating layer that is a height from an interface between the insulating layer and the inner layer board to an interface where the insulating layer and the support are bonded is the lowest, and at the highest point the height of the insulating layer is the highest.

Effect of the Invention

According to the present invention, because the adhesive sheet in used comprises a support exhibiting the predetermined expansion properties even when the insulating layer is formed by thermally curing the resin composition layer with the support attached to the resin composition layer, the phenomena in which the resin composition is pushed by the support in the vicinity of the end part of the support at the time of thermal curing to run on the support and in which the resin composition is raised to such an extent that the raised part exceeds the thickness of the support can be effectively reduced. In addition, the flatness of the insulation layer formed can be ensured even when the resin composition is raised. Consequently, the uniformity of the thickness of the insulation layer formed in the subsequent buildup step can be improved. As a result, a method for manufacturing a printed wiring board that can further improve the yield can be provided.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein.

EXPLANATION OF THE REFERENCE LETTERS OR NUMERALS

Figure 1:
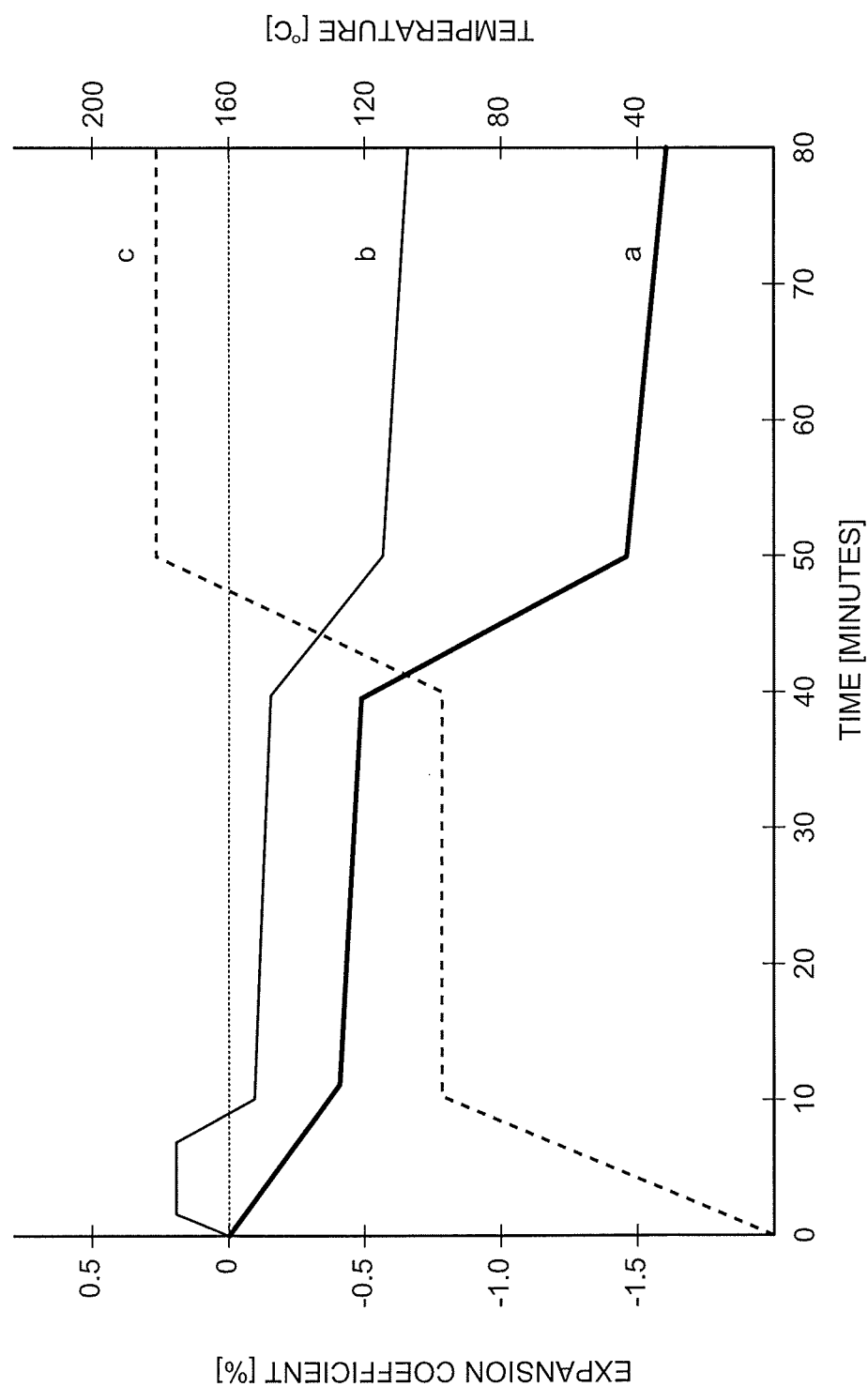
FIG. 1 is a schematic graph illustrating an expansion behavior of a support in the TD and MD directions during heating.

10 Laminated Structure
10A Central Part
10B End Part
10C Raised Part
22 Support
22a Edge Part
22b Surface
24 Insulating Layer
30 Inner Layer Board

DETAILED DESCRIPTION OF THE PREFERRED EMBODIMENTS

Description of Terms

In the present invention, the "MD direction (Machine Direction)" of the support means the longitudinal direction of the support at the time of manufacturing the support, that is, the conveying direction of the long-length support at the time of production. The "TD direction (Transverse Direction)" of the support means the width direction of the support at the time of manufacturing the support and is orthogonal to the MD direction. Both the MD direction and the TD direction are directions orthogonal to the thickness direction of the support.

In the present invention, the "expansion coefficient" of the support in the MD direction or the TD direction of the support means the increased ratio (%) in the length (size) of the support in the MD direction or the TD direction of the support when the support is heated under predetermined heating conditions. The expansion coefficient (%) of the support can be determined by Formula: $(L-L_0)/L_0 \times 100$, where the initial length (that is, the length of the support at the time of the start of heating) is $L_0$ and the length of the support after heating for a predetermined time is L. A positive expansion coefficient indicates that the support expands by heating, whereas a negative expansion value indicates that the support shrinks by heating. The expansion coefficient (%) of the support can be determined by measuring the change in the length of the support in the MD direction or the TD direction of the support when the support is heated under the predetermined heating conditions, using a thermomechanical analyzer. Examples of thermomechanical analyzer may include "Thermo Plus TMA8310" manufactured by Rigaku Corporation and "TMA-SS6100" manufactured by Seiko Instruments Inc.

In the present invention, the "maximum expansion coefficient" of the support in the MD direction or the TD direction of the support means an expansion coefficient indicating the maximum value when the expansion coefficient is checked with time in accordance with the following heating conditions.

Heating conditions: temperature is raised from 20° C. to 100° C. at a rate of temperature rise of 8° C./min and heating is carried out at 100° C. for 30 minutes, and thereafter the temperature is raised to 180° C. at a rate of temperature rise of 8° C./min and heating is carried out at 180° C. for 30 minutes.

The heating conditions are conditions for specifying properties such as the expansion coefficient of the support and may correspond to or may not correspond to conditions in "Step (B) of forming insulating layer by thermally curing resin composition layer" described below.

Before the method for manufacturing a printed wiring board of the present invention is described in detail, the "support" used in the method for manufacturing of the present invention will be described.

Support

The support of the present invention satisfies the following condition (MD1) and condition (TD1) or the following condition (MD2) and condition (TD2), when it is heated under the following heating condition.

Heating conditions: temperature is raised from 20° C. to 100° C. at a rate of temperature rise of 8° C./min and heating is carried out at 100° C. for 30 minutes, and thereafter the temperature is raised to 180° C. at a rate of temperature rise of 8° C./min and heating is carried out at 180° C. for 30 minutes.

Condition (MD1): a maximum expansion coefficient $E_{MD}$ (%) in an MD direction at 120° C. or more is less than 0.2%.

Condition (TD1): a maximum expansion coefficient $E_{TD}$ (%) in a TD direction at 120° C. or more is less than 0.2%.

Condition (MD2): the maximum expansion coefficient $E_{MD}$ (%) in the MD direction at 100° C. or more is less than 0%.

Condition (TD2): the maximum expansion coefficient $E_{TD}$ (%) in the TD direction at 100° C. or more is less than 0%.

Generally, the support expands or shrinks by heating. The degree of expansion and/or shrinkage at the time of heating varies depending on the type of the support. Due to the production steps (for example, selection of constituent materials of the support and tension applied at the time of winding (conveying) the conveyed support), the support is likely to shrink more in the MD direction than in the TD direction and likely to expand more in the TD direction than in the MD direction when the support is heated.

Generally, the temperature at which the support starts to suddenly expand is about 120° C. In the present invention, the support satisfies the following condition (MD1) and condition (TD1).

Condition (MD1)

The condition (MD1) relates to the maximum expansion coefficient $E_{MD}$ in the MD direction at 120° C. or more. When the insulating layer is formed by thermally curing the resin composition layer with the support attached to the resin composition layer, the maximum expansion coefficient $E_{MD}$ is less than 0.2%. The lower limit of the maximum expansion coefficient $E_{MD}$ is preferably −4% or more, more preferably −3% or more, and further preferably −2% or more from the viewpoint of improving the uniformity of roughness after roughening the surface of the insulating layer. The lower limit of the maximum expansion coefficient $E_{MD}$ is preferably closer to 0% from the viewpoint of improving the flatness of the insulating layer and the uniformity of the roughness after roughening the surface of the insulating layer, thereby to improve the yield of the wiring board.

Condition (TD1)

The condition (TD1) relates to the maximum expansion coefficient $E_{TD}$ in the TD direction at 120° C. or more. When the insulating layer is formed by thermally curing the resin composition layer with the support attached to the resin composition layer, the maximum expansion coefficient $E_{TD}$ is less than 0.2%. The lower limit of the maximum expansion coefficient $E_{TD}$ is preferably −3% or more and more preferably −2% or more from the viewpoint of improving the uniformity of roughness after roughening the surface of the insulating layer. The lower limit of the maximum expansion coefficient $E_{TD}$ is preferably closer to 0% from the viewpoint of improving the flatness of the insulating layer and the uniformity of the roughness after roughening the surface of the insulating layer, thereby to improve the yield of the wiring board.

Considering that the temperature at which the resin composition starts to be cured is about 100° C., in the present invention, the support preferably satisfies the following condition (MD2) and condition (TD2), Condition (MD2)

The condition (MD2) relates to the maximum expansion coefficient $E_{MD}$ in the MD direction at 100° C. or more. When the insulating layer is formed by thermally curing the resin composition layer with the support attached to the resin composition layer, the maximum expansion coefficient $E_{MD}$ is less than 0%. The lower limit of the maximum expansion coefficient $E_{MD}$ is not particularly limited and is similar to that of the above condition (MD1). The lower limit of the maximum expansion coefficient $E_{MD}$ is preferably closer to 0% from the viewpoint of improving the flatness of the insulating layer and the uniformity of the roughness after roughening the surface of the insulating layer, thereby to improve the yield of the printed wiring board.

Condition (TD2)

The condition (TD1) relates to the maximum expansion coefficient $E_{TD}$ in the TD direction at 100° C. or more. When the insulating layer is formed by thermally curing the resin composition layer with the support attached to the resin composition layer, the maximum expansion coefficient $E_{TD}$ is less than 0%. The lower limit of the maximum expansion coefficient $E_{TD}$ is not particularly limited and is similar to that of the above condition (TD1). The lower limit of the maximum expansion coefficient $E_{TD}$ is preferably closer to 0% from the viewpoint of improving the flatness of the insulating layer and the uniformity of the roughness after roughening the surface of the insulating layer, thereby to improve the yield of the printed wiring board.

Generally, the temperature at which the support starts to suddenly expand is about 120° C. In the present invention, the support satisfies the following condition (MD3) and condition (TD3).

Condition (MD3)

In the condition (MD3), a temperature at which an expansion coefficient in an MD direction becomes maximum under the above heating condition is less than 120° C.

Condition (TD3)

In the condition (TD3), a temperature at which an expansion coefficient becomes maximum in a TD direction under the above heating condition is less than 120° C.

Therefore, when the support satisfies the condition (MD3) and condition (TD3), the expansion of the support at 120° C. or more is controlled under the above heating condition, so that the flatness of the insulating layer and the uniformity of the roughness of the surface of the insulating layer after roughening can be improved and thus yield of the printed wiring board can be improved.

Generally, the temperature at which the support starts to suddenly expand is about 120° C. In the present invention, the support satisfies the following condition (MD4) and condition (TD4).

In the condition (MD4), a temperature at which an expansion coefficient of the support in an MD direction becomes maximum is less than 120° C.

In the condition (TD4), a temperature at which an expansion coefficient of the support in a TD direction becomes maximum is less than 120° C.

By using a support having such properties, the expansion of the support at 120° C. or more is controlled, so that the resin composition is not pushed by the support in the vicinity of the edge part of the support. This can improve the flatness of the insulating layer, and as a result, the yield of the printed wiring board can be further improved.

The temperature at which the expansion coefficient of the support in the MD direction is the maximum is not particularly limited and is 60° C. or more, or 80° C. or more. The temperature at which the expansion coefficient of the support in the TD direction is the maximum is not particularly limited and is 60° C. or more, or 80° C. or more.

As the support, a film made of a plastic material (hereinafter also simply referred to as a "plastic film") is suitably used because it is lightweight and exhibits strength necessary at the time of manufacturing the printed wiring board. Examples of the plastic material may include polyesters such as polyethylene terephthalate (referred to as "PET"), polyethylene naphthalate (referred to as "PEN"), polycarbonate (referred to as "PC"), acrylic resins such as polymethyl methacrylate (PMMA), cyclic polyolefins, triacetyl cellulose (TAC), polyether sulfide (PES), polyether ketone, and polyimide. Among them, polyethylene terephthalate and polyethylene naphthalate are preferable, and inexpensive polyethylene terephthalate is particularly preferable as the support.

With regard to a conventional plastic film used for the adhesive sheet, the inventors of the present invention have found that the following problems. The conventional plastic film does not satisfy one of or both of the conditions (MD1 to MD4) (hereinafter referred to as conditions (MD)) or conditions (TD1 to TD4) (hereinafter referred to as conditions (TD)), particularly the condition (TD1, TD2, TD3, or TD4), so that, in the thermal curing step, the resin composition is pushed by the support in the vicinity of the edge part of the support to run on the support or the resin composition is raised to such an extent that the raised part exceeds the thickness of the support. Consequently, the flatness of the insulating layer formed in a step of bonding the further adhesive sheet in a subsequent buildup step is impaired, and winkles and lifting of the support are caused to lower the yield of the printed wiring board, or a phenomenon in which the raised part is dropped out and separated and further adheres to the insulating layer ("resin chip adhesion") occurs in the step of peeling off the support so as to lower the yield of the printed wiring board.

In a suitable embodiment of the present invention, the plastic film is subjected to preheating treatment to prepare a support that satisfies both the conditions (MD) and conditions (TD). The preheating treatment can be carried out by adjusting conditions depending on the type of the plastic material, the presence or absence of the tension (stretching) applied at the time of production, the axial direction of the stretching, the degree of the stretching, and the heat treatment conditions after the stretching so that the combination of the condition (MD) and the condition (TD) can be satisfied.

When a long plastic film is used as the plastic film, examples of the preheating treatment for allowing the support to satisfy the conditions (MD) and the conditions (TD) may include treatment of heating while applying tension in one or both of the MD direction and the TD direction of the plastic film.

When the long plastic film is used, generally, a predetermined tension is applied in the MD direction by conveying using rolls such as conveying rolls at the time of production, so that the support satisfying the conditions (MD) and the conditions (TD) may be obtained by heating while applying tension only in the TD direction.

In the MD direction, the predetermined tension can be applied by adjusting the tension applied to the plastic film stretched between a plurality of rolls. Application of the tension in the TD direction can be carried out by any conventionally known suitable means. When the tension is applied in the TD direction, a predetermined tension can be applied using, for example, a tenter having a conventionally known configuration.

The predetermined tension can also be applied in the MD direction or the TD direction of the plastic film using, for example, the weight and gravity of the weight. Specifically, the edge part of one side in the direction where the plastic film is to be adjusted is fixed to, for example, a support rod with any suitable adhesive member (for example, a Kapton adhesive tape, a PTFE adhesive tape, or a glass cloth adhesive tape), so that the direction to be adjusted in the TD direction or the MD direction corresponds to the vertical direction, and the plastic film is suspended so that tension is uniformly applied to the entire plastic film. Thereafter, the preheating treatment can be carried out by heating while applying the tension by connecting the weight such as a metal plate at the opposite edge part in the direction to be adjusted using any suitable adhesion member so that the tension is applied to the entire plastic film.

As the magnitude of the tension applied to the plastic film, any suitable tension can be set in consideration of, for example, the material of the plastic film, the expansion coefficient, and the composition of the resin composition. For example, the condition in which the tension is set to 3 $gf/cm^2$ to 30 $gf/cm^2$ can be included. In one embodiment, the heating temperature of the preheating treatment is preferably (Tg+50°) C. or more, more preferably (Tg+60°) C. or more, further preferably (Tg+70°) C. or more, and further more preferably (Tg+80°) C. or more or (Tg+90°) C. or more, when the glass transition temperature of the plastic film is abbreviated as Tg. The upper limit of the heating temperature is preferably (T+115°) C. or less, more preferably (Tg+110°) C. or less, and further preferably (Tg+105°) C. or less, as long as the upper limit is less than the melting point of the plastic film.

When the support is, for example, a PET film, the heating temperature of the preheating treatment is preferably 130° C. or more, more preferably 140° C. or more, further preferably 150° C. or more, and further more preferably 160° C. or more or 170° C. or more. The upper limit of the heating temperature is preferably 195° C. or less, more preferably 190° C. or less, and further preferably 185° C. or less.

The heating time may be appropriately determined in accordance with the heating temperature so as to satisfy the condition (MD1) and the condition (TD1), the condition (MD2) and the condition (TD2), or the condition (MD3) and the condition (TD3). In one embodiment, the heating time is preferably 1 minute or more, more preferably 2 minutes or more, further preferably 5 minutes or more, 10 minutes or more, or 15 minutes or more. The upper limit of the heating time depends on the heating temperature and is preferably 120 minutes or less, more preferably 90 minutes or less, and further preferably 60 minutes or less.

The atmosphere at the time of carrying out the preheating treatment is not particularly limited. The examples may include an air atmosphere and an inert gas atmosphere (for example, a nitrogen gas atmosphere, a helium gas atmosphere, and an argon gas atmosphere). The air atmosphere is preferable from the viewpoint of easily preparing the support.

The preheating treatment may be carried out under any of a reduced pressure, a normal pressure, or an increased pressure, and is preferably carried out under a normal pressure from the viewpoint of easily preparing the support.

The surface of the support to be bonded to the resin composition layer described below may be subjected to mat treatment or corona treatment. As the support, a support with a releasing layer may be used. The releasing layer is provided on the surface to be bonded to the resin composition layer. Examples of releasing agents used for the releasing layer of the support with a releasing layer may include one or more types of releasing agents selected from the group consisting of an alkyd resin, a polyolefin resin, a urethane resin, and a silicone resin.

The thickness of the support is not particularly limited and is preferably in a range of 5 μm to 75 μm, more preferably in a range of 10 μm to 60 μm, and further preferably in a range of 10 μm to 45 μm. In particular, the thickness is preferably 25 μm or more and more preferably 30 μm or more from the viewpoint of preventing the resin from rising. When the support with a releasing layer is used, the thickness of the entire support with a releasing layer is preferably within the above range.

Figure 2:
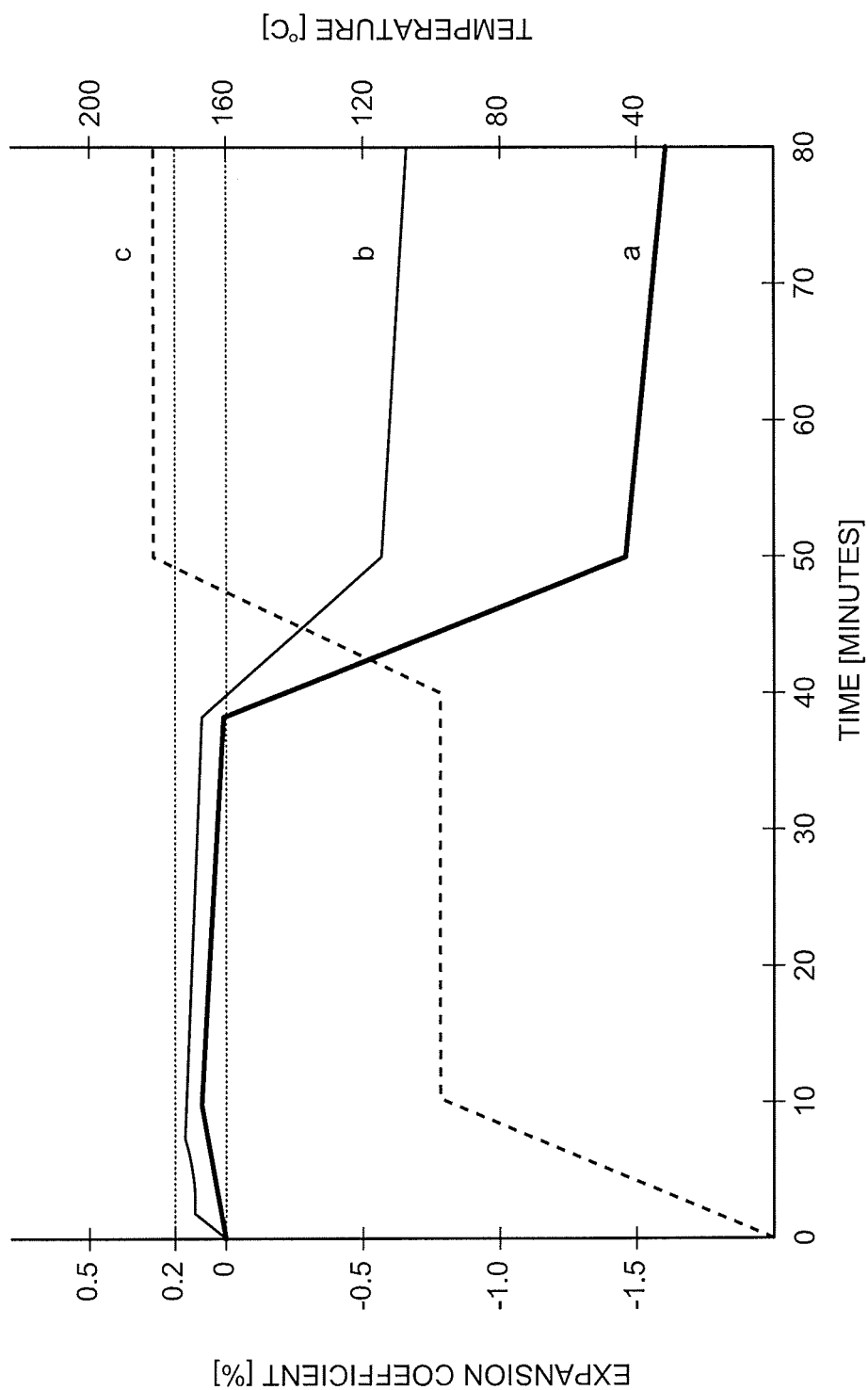
FIG. 2 is a schematic graph illustrating the expansion behavior of the support in the TD and MD directions during heating.
Figure 3:
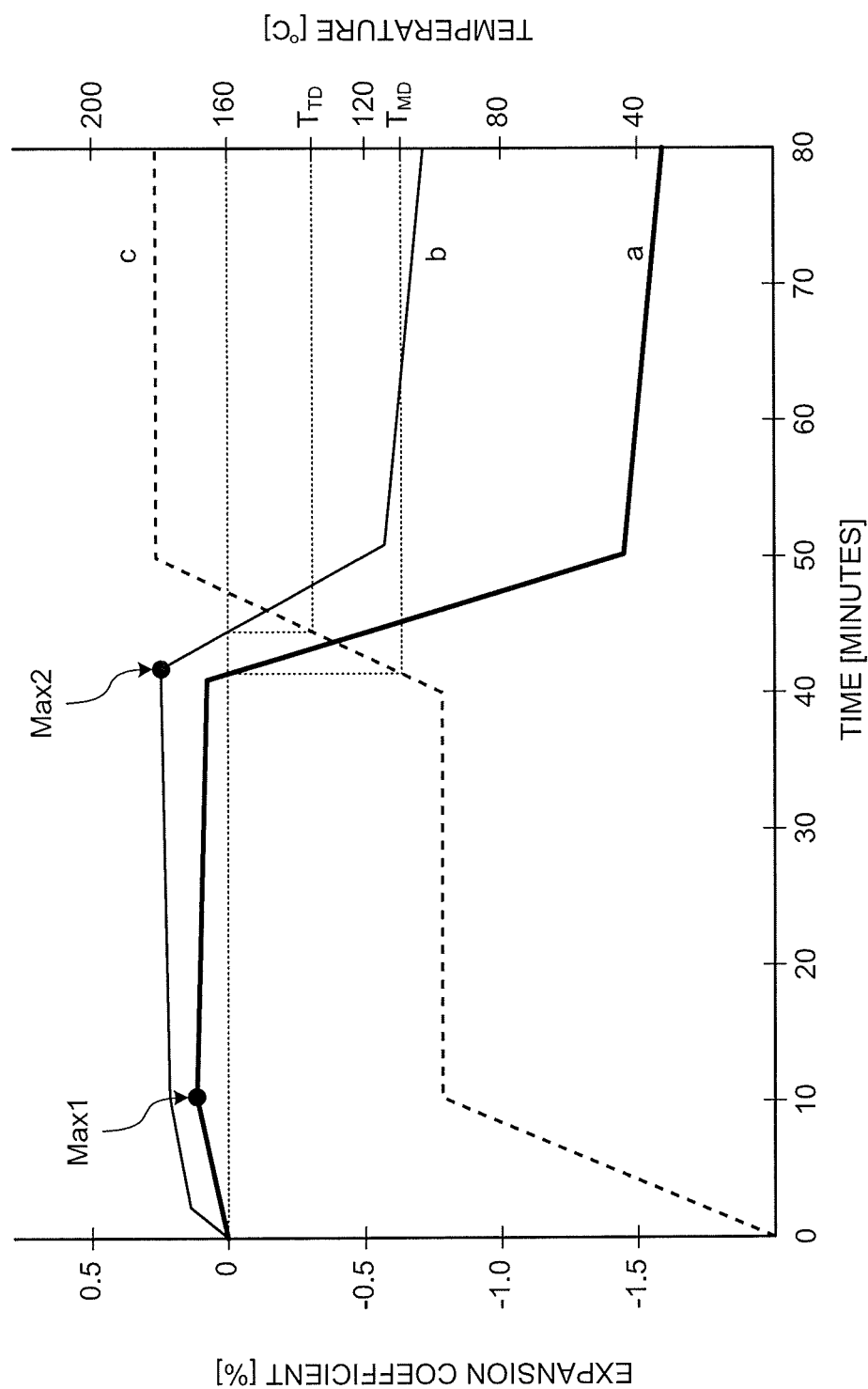
FIG. 3 is a schematic graph illustrating the expansion behavior of the support in the TD and MD directions during heating.

With reference to FIGS. 1 to 3, the expansion behavior of the support according to an embodiment of the present invention will be described briefly.

FIGS. 1 to 3 are graphs schematically illustrating the expansion behavior of the support in the TD direction and the MD direction when the support is heated under the above heating conditions. In FIGS. 1 to 3, the left vertical axis represents the expansion coefficient (%) in the TD direction and the MD direction of the support, the right vertical axis represents the heating temperature (° C.), and the horizontal axis represents the heating time (minute). The graph illustrates the expansion behavior in the MD direction, the graph b illustrates the expansion behavior in the TD direction, and the graph c illustrates a temperature profile over time.

As is clear from FIG. 1, according to the graph a, the expansion coefficient decreases to a negative value in the process of raising the temperature from 20° C. to 100° C. at a rate of temperature rise of 8° C./min (section of a heating time of 0 minutes to 10 minutes) and the expansion coefficient gradually decreases in the process of heating at 100° C. for 30 minutes (section of a heating time of 10 minutes to 40 minutes) in the temperature profile illustrated in the graph c.

According to the graph a, the expansion coefficient significantly decreases in the process of raising the temperature from 100° C. to 180° C. at a rate of temperature rise of 8° C./min (section of a heating time of 40 minutes to 50 minutes) and the expansion coefficient gradually decreases in the process of heating at 180° C. for 30 minutes (section of a heating time of 50 minutes to 80 minutes) in the temperature profile illustrated in the graph c. According to the graph b, the expansion coefficient becomes slightly higher but decreases to a negative value when the temperature reaches 100° C. in the process of raising the temperature from 20° C. to 100° C. at a rate of temperature rise of 8° C./min (section of a heating time of 0 minutes to 10 minutes) and the expansion coefficient gradually decreases in the process of heating at 100° C. for 30 minutes (section of a heating time of 10 minutes to 40 minutes) in the temperature profile illustrated in the graph c. According to the graph b, the expansion coefficient significantly decreases in the process of raising the temperature from 100° C. to 180° C. at a rate of temperature rise of 8° C./min (section of a heating time of 40 minutes to 50 minutes) and the expansion coefficient gradually decreases in the process of heating at 180° C. for 30 minutes (section of a heating time of 50 minutes to 80 minutes) in the temperature profile illustrated in the graph c.

With reference to FIG. 2, the expansion behavior of the support according to another embodiment of the present invention will be described briefly.

As is clear from FIG. 2, according to the graph a, the expansion coefficient becomes slightly higher but remains to be less than 0.2% in the process of raising the temperature from 20° C. to 100° C. at a rate of temperature rise of 8° C./min (section of a heating time of 0 minutes to 10 minutes) and the expansion coefficient gradually decreases in the process of heating at 100° C. for 30 minutes (section of a heating time of 10 minutes to 40 minutes) in the temperature profile illustrated in the graph c. According to the graph a, the expansion coefficient significantly decreases in the process of raising the temperature from 100° C. to 180° C. at a rate of temperature rise of 8° C./min (section of a heating time of 40 minutes to 50 minutes) and the expansion coefficient gradually decreases in the process of heating at 180° C. for 30 minutes (section of a heating time of 50 minutes to 80 minutes) in the temperature profile illustrated in the graph c. According to the graph b, the expansion coefficient becomes slightly higher but remains to be less than 0.2% in the process of raising the temperature from 20° C. to 100° C. at a rate of temperature rise of 8° C./min (section of a heating time of 0 minutes to 10 minutes) and the expansion coefficient gradually decreases in the process of heating at 100° C. for 30 minutes (section of a heating time of 10 minutes to 40 minutes) in the temperature profile illustrated in the graph c. According to the graph b, the expansion coefficient significantly decreases in the process of raising the temperature from 100° C. to 180° C. at a rate of temperature rise of 8° C./min (section of a heating time of 40 minutes to 50 minutes) and the expansion coefficient gradually decreases in the process of heating at 180° C. for 30 minutes (section of a heating time of 50 minutes to 80 minutes) in the temperature profile illustrated in the graph c.

With reference to FIG. 3, the expansion behavior of the support according to another embodiment of the present invention will be described briefly.

As is clear from FIG. 3, according to the graph a, the expansion coefficient becomes slightly higher to reach the maximum expansion point Max1 where the expansion coefficient becomes maximum in the process of raising the temperature from 20° C. to 100° C. at a rate of temperature rise of 8° C./min (section of a heating time of 0 minutes to 10 minutes) and the expansion coefficient gradually decreases from the maximum expansion point Max1 in the process of heating at 100° C. for 30 minutes (section of a heating time of 10 minutes to 40 minutes) in the temperature profile illustrated in the graph c. According to the graph a, the expansion coefficient significantly decreases in the process of raising the temperature from 100° C. to 180° C. at a rate of temperature rise of 8° C./min (section of a heating time of 40 minutes to 50 minutes) and the expansion coefficient gradually decreases in the process of heating at 180° C. for 30 minutes (section of a heating time of 50 minutes to 80 minutes) in the temperature profile illustrated in the graph c. According to the graph b, the expansion coefficient becomes slightly higher in the process of raising the temperature from 20° C. to 100° C. at a rate of temperature rise of 8° C./min (section of a heating time of 0 minutes to 10 minutes) and the expansion coefficient becomes further slightly higher to reach the maximum expansion point Max2 where the expansion coefficient becomes maximum in the process of heating at 100° C. for 30 minutes (section of a heating time of 10 minutes to 40 minutes) in the temperature profile illustrated in the graph c. According to the graph b, the expansion coefficient significantly decreases from the maximum expansion point Max2 in the process of raising the temperature from 100° C. to 180° C. at a rate of temperature rise of 8° C./min (section of a heating time of 40 minutes to 50 minutes) and the expansion coefficient gradually decreases in the process of heating at 180° C. for 30 minutes (section of a heating time of 50 minutes to 80 minutes) in the temperature profile illustrated in the graph c. As is clear from the graphs a and b, in both of the expansion behavior in the MD direction and the expansion behavior in the TD direction, the maximum expansion points Max1 and Max2 are present at 120° C. or less and the expansion coefficient at 120° C. or more does not exceed the expansion coefficients at the maximum expansion points Max1 and Max2.

Adhesive Sheet

The "adhesive sheet" used in the method for manufacturing a printed wiring board of the present invention will be described.

The adhesive sheet of the present invention comprises the above-described support. Specifically, the adhesive sheet of the present invention preferably comprises the support that satisfies the following condition (MD1) and condition (TD1) when it is heated under the following heating conditions:

Heating conditions: temperature is raised from 20° C. to 100° C. at a rate of temperature rise of 8° C./min and heating is carried out at 100° C. for 30 minutes, and thereafter the temperature is raised to 180° C. at a rate of temperature rise of 8° C./min and heating is carried out at 180° C. for 30 minutes, and the resin composition layer bonded to the support.

Condition (MD1): a maximum expansion coefficient $E_{MD}$ (%) in an MD direction at 120° C. or more is less than 0.2%.

Condition (TD1): a maximum expansion coefficient $E_{TD}$ (%) in a TD direction at 120° C. or more is less than 0.2%.

The support in the adhesive sheet preferably satisfies the following condition (MD2) and condition (TD2).

Condition (MD2): the maximum expansion coefficient $E_{MD}$ (%) in the MD direction at 100° C. or more is less than 0%.

Condition (TD2): the maximum expansion coefficient $E_{TD}$ (%) in the TD direction at 100° C. or more is less than 0%.

The adhesive sheet preferably comprises the support that satisfies the following condition (MD3) and condition (TD3) when it is heated under the following heating conditions, and a resin composition layer bonded to the support.

Heating conditions: temperature is raised from 20° C. to 100° C. at a rate of temperature rise of 8° C./min and heating is carried out at 100° C. for 30 minutes, and thereafter the temperature is raised to 180° C. at a rate of temperature rise of 8° C./min and heating is carried out at 180° C. for 30 minutes.

Condition (MD3): a temperature at which an expansion coefficient in an MD direction becomes maximum is less than 120° C.

Condition (TD3): a temperature at which an expansion coefficient in a TD direction becomes maximum is less than 120° C.

The adhesive sheet preferably comprises the support satisfying the following condition (MD4) and condition (TD4), and a resin composition layer bonded to the support.

Condition (MD4): a temperature at which an expansion coefficient of the support in an MD direction becomes maximum is less than 120° C.

Condition (TD4): a temperature at which an expansion coefficient of the support in a TD direction becomes maximum is less than 120° C.

The details of the expansion properties of the support in the MD direction and the TD direction and the conditions of the preheating treatment when the support is heated under the above heating conditions are as described above.

Resin Composition Layer

The resin composition used for the resin composition layer comprised in the adhesive sheet is not particularly limited as long as the cured product of the resin composition has sufficient hardness and insulating properties. The resin composition used for the resin composition layer preferably comprises an inorganic filler from the viewpoint of lowering the thermal expansion coefficient of the obtained insulating layer to prevent cracks and circuit distortion caused by the difference in thermal expansion between the insulating layer and the conductor layer.

The content of the inorganic filler in the resin composition is preferably 30% by mass or more, more preferably 45% by mass or more, and further preferably 60% by mass or more from the viewpoint of lowering the thermal expansion coefficient of the obtained insulating layer.

In the present invention, the content of each component constituting the resin composition is the amount when the total mass of the nonvolatile components in the resin composition is determined to be 100% by mass.

The upper limit of the content of the inorganic filler in the resin composition is preferably 95% by mass or less, more preferably 85% by mass or less, and further preferably 75% by mass or less from the viewpoint of the mechanical strength of the obtained insulating layer.

The inorganic filler is not particularly limited and the examples may include silica, alumina, glass, cordierite, silicon oxide, barium sulfate, barium carbonate, talc, clay, mica powder, zinc oxide, hydrotalcite, boehmite, aluminum hydroxide, magnesium hydroxide, calcium carbonate, magnesium carbonate, magnesium oxide, boron nitride, aluminum nitride, manganese nitride, aluminum borate, strontium carbonate, strontium titanate, calcium titanate, magnesium titanate, bismuth titanate, titanium oxide, zirconium oxide, barium titanate, barium zirconate titanate, barium zirconate, calcium zirconate, zirconium phosphate, and zirconium phosphate tungstate. Among them, amorphous silica, fused silica, crystalline silica, synthetic silica, and hollow silica are particularly suitable. As the silica, spherical silica is preferable. The inorganic fillers may be used singly or in combination of two or more of them. Examples of commercially available spherical fused silica may include "SOC 2" and "SOC 1" manufactured by Admatechs Company Limited.

The average particle diameter of the inorganic filler used in the resin composition is preferably in a range of 0.01 µM to 5 µm, more preferably in a range of 0.05 µm to 2 µm, further preferably in a range of 0.1 µm to 1 µm, and further more preferably 0.2 µm to 0.8 µm. The average particle diameter of the inorganic filler can be measured by a laser diffraction-scattering method based on Mie scattering theory. Specifically, the average particle diameter can be measured by making the particle size distribution of the inorganic filler on a volume basis with a laser diffraction-scattering type particle size distribution measuring apparatus and determining the median diameter to be the average particle diameter. As the measurement sample, a sample prepared by dispersing the inorganic filler in water by use of ultrasonic waves can be preferably used. As the laser diffraction-scattering type particle size distribution measuring apparatus, for example, "LA-500" manufactured by HORIBA, Ltd. can be used.

The inorganic filler is preferably treated with one or more surface treatment agents selected from, for example, an aminosilane-based coupling agent, an epoxysilane-based coupling agent, a mercaptosilane-based coupling agent, a silane-based coupling agent, an organosilazane compound, and a titanate-based coupling agents from the viewpoint of improving moisture resistance and dispersibility. Examples of commercially available surface treatment agents may include "KBM403" (3-glycidoxypropyltrimethoxysilane) manufactured by Shin-Etsu Chemical Co., Ltd., "KBM803" (3-mercaptopropyltrimethoxysilane) manufactured by Shin-Etsu Chemical Co., Ltd., "KBE903" (3-aminopropyltriethoxysilane) manufactured by Shin-Etsu Chemical Co., Ltd., "KBM573" (N-phenyl-3-aminopropyltrimethoxysilane) manufactured by Shin-Etsu Chemical Co., Ltd., and "SZ-31" (hexamethyldisilazane) manufactured by Shin-Etsu Chemical Co., Ltd.

The degree of the surface treatment with the surface treatment agent can be evaluated by the amount of carbon per unit surface area of the inorganic filler. The amount of carbon per unit surface area of the inorganic filler is preferably 0.02 mg/m$^2$ or more, more preferably 0.1 mg/m$^2$ or more, and further preferably 0.2 mg/m$^2$ or more from the viewpoint of improving the dispersibility of the inorganic filler. On the other hand, the amount of carbon per unit surface area of the inorganic filler is preferably 1 mg/m$^2$ or less, more preferably 0.8 mg/m$^2$ or less, and further preferably 0.5 mg/m$^2$ or less from the viewpoint of preventing increase in the melt viscosity of the resin varnish and the melt viscosity when the adhesive sheet is formed.

The amount of carbon per unit surface area of the inorganic filler can be measured after the inorganic filler that has been subjected to the surface treatment is washed with a solvent (for example, methyl ethyl ketone (MEK)). Specifically, a sufficient amount of MEK as a solvent is added to the inorganic filler that has been surface-treated with the surface treatment agent, and the inorganic filler is ultrasonically washed at 25° C. for 5 minutes. After removing the supernatant liquid and drying the nonvolatile components, the amount of carbon per unit surface area of the inorganic filler can be measured with a carbon analyzer. As the carbon analyzer, for example, "EMIA-320V" manufactured by HORIBA, Ltd. can be used.

The resin composition used for the resin composition layer comprises a thermosetting resin as a material. As the thermosetting resin, a conventionally known thermosetting resin used at the time of forming an insulating layer of a printed wiring board can be used, and among them, an epoxy resin is preferable. The resin composition may also comprise a curing agent, if necessary. In one embodiment, a resin composition comprising the inorganic filler, the epoxy resin, and the curing agent can be used. The resin composition used for the resin composition layer may further comprise additives such as a thermoplastic resin, a curing accelerator, a flame retardant, and rubber particles.

Hereinafter, the epoxy resin, the curing agent, and additives that can be used as the materials of the resin composition will be described.

Epoxy Resin

Examples of the epoxy resin may include a bisphenol A epoxy type resin, a bisphenol F type epoxy resin, a bisphenol S type epoxy resin, a bisphenol AF type epoxy resin, a dicyclopentadiene type epoxy resin, a trisphenol type epoxy resin, a naphthol novolak type epoxy resin, a phenol novolak type epoxy resin, a tert-butyl-catechol type epoxy resin, a naphthalene type epoxy resin, a naphthol type epoxy resin, an anthracene type epoxy resin, a glycidylamine type epoxy resin, a glycidyl ester type epoxy resin, a cresol novolac type epoxy resin, a biphenyl type epoxy resin, a linear aliphatic epoxy resin, an epoxy resin having a butadiene structure, an alicyclic epoxy resin, a heterocyclic epoxy resin, a Spiro ring containing epoxy resin, a cyclohexane dimethanol type epoxy resin, a naphthylene ether type epoxy resin, and a trimethylol type epoxy resin. These epoxy resins may be used singly or in combination of two or more of them.

The epoxy resin preferably includes an epoxy resin comprising two or more epoxy groups in one molecule. When the nonvolatile component of the epoxy resin is determined to be 100% by mass, the epoxy resin preferably comprises the epoxy resin having two or more epoxy groups in one molecule at least in an amount of 50% by mass or more. Among them, the epoxy resin comprising an epoxy resin having two or more epoxy groups in one molecule and being a liquid state at a temperature of 20° C. (hereinafter, referred to as a "liquid epoxy resin") and an epoxy resin having three or more epoxy groups in one molecule and being a solid state at a temperature of 20° C. (hereinafter, referred to as a "solid epoxy resin") are preferable. The resin composition having excellent flexibility can be obtained by using both of the liquid epoxy resin and the solid epoxy resin as the epoxy resin. The breaking strength of the insulating layer formed by curing the resin composition is also improved.

Preferable examples of the liquid epoxy resin may include a bisphenol A type epoxy resin, a bisphenol F type epoxy resin, a phenol novolak type epoxy resin, and a naphthalene type epoxy resin. The bisphenol A type epoxy resin, the bisphenol F type epoxy resin, and the naphthalene type epoxy resin are preferable and the bisphenol A type epoxy resin and the bisphenol F type epoxy resin are further preferable. Specific examples of the liquid epoxy resin may include "HP4032", "HP4032D", and "HP4032SS" (naphthalene type epoxy resins) manufactured by DIC Corporation, "jER828EL" (a bisphenol A type epoxy resin), "jER807" (a bisphenol F type epoxy resin), and "jER152" (a phenol novolak type epoxy resin) manufactured by Mitsubishi Chemical Corporation, "ZX1059" (a mixture of a bisphenol A type epoxy resin and a bisphenol F type epoxy resin) manufactured by NIPPON STEEL & SUMIKIN CHEMICAL CO., LTD., and "EX-721" (a glycidyl ester type epoxy resin) manufactured by Nagase ChemteX Corporation. These resins may be used singly or in combination of two or more of them.

Preferable examples of the solid epoxy resin may include a naphthalene type tetrafunctional epoxy resin, a cresol novolak type epoxy resin, a dicyclopentadiene type epoxy resin, a trisphenol type epoxy resin, a naphthol novolak type epoxy resin, a biphenyl type epoxy resin, or a naphthylene ether type epoxy resin. The naphthalene type tetrafunctional epoxy resin, the biphenyl type epoxy resin, or the naphthylene ether type epoxy resin is more preferable, and the naphthalene type tetrafunctional epoxy resin and the biphenyl type epoxy resin are further preferable. Specific examples of the solid epoxy resin may include "HP4032H", "HP-4700", and "HP-4710" (naphthalene type tetrafunctional epoxy resins), "N-690" (a cresol novolak type epoxy resin), "N-695" (a cresol novolak type epoxy resin), "HP-7200" (a dicyclopentadiene type epoxy resin), "EXA7311", "EXA7311-G3", "EXA7311-G4", "EXA7311-G4S", and "HP6000" (naphthylene ether type epoxy resins) manufactured by DIC Corporation, "EPPN-502H" (a trisphenol type epoxy resin), "NC7000L" (a naphthol novolak type epoxy resin), "NC3000H", "NC3000", "NC3000L", and "NC3100" (biphenyl type epoxy resins) manufactured by Nippon Kayaku Co., Ltd., "ESN475" (a naphthol novolak type epoxy resin) and "ESN485V" (a naphthol novolak type epoxy resin) manufactured by NIPPON STEEL & SUMIKIN CHEMICAL CO., LTD., "YX4000H" and "YL6121" (biphenyl type epoxy resins), "YX4000HK" (a bixylenol type epoxy resin) manufactured by Mitsubishi Chemical Corporation, "PG-100" and "CG-500" manufactured by Osaka Gas Chemicals Co., Ltd. and "YL7800" (a fluorene type epoxy resin) manufactured by Mitsubishi Chemical Corporation.

When both of the liquid epoxy resin and the solid epoxy resin are used as the epoxy resin, the quantitative ratio of the resins (liquid epoxy resin solid epoxy resin) is preferably in a range of 1:0.1 to 1:5 in a ratio by mass. By setting the amount ratio of the liquid epoxy resin and the solid epoxy resin to the range, effects as described below can be obtained. Namely, i) appropriate adhesiveness is provided when the resin composition is used in the form of an adhesive sheet, ii) sufficient flexibility and an improved handleability can be obtained when the resin composition is used in the form of an adhesive sheet, and iii) the insulating layer having sufficient breaking strength can be obtained. From the viewpoint of the effects of i) to iii), the quantitative ratio of the liquid epoxy resin and the solid epoxy resin (liquid epoxy resin:solid epoxy resin) is more preferably in a range of 1:0.3 to 1:4, further preferably in a range of 1:0.6 to 1:3, and particularly preferably 1:0.8 to 1:2.5 in a ratio by mass.

The content of the epoxy resin in the resin composition is preferably 3% by mass to 50% by mass, more preferably 5% by mass to 45% by mass, further preferably 5% by mass to 40% by mass, and further more preferably 7% by mass to 35% by mass.

The weight average molecular weight of the epoxy resin is preferably 100 to 5,000, more preferably 250 to 3,000, and further preferably 400 to 1,500. Here, the weight average molecular weight of the epoxy resin is a weight average molecular weight in terms of polystyrene measured by a gel permeation chromatography (GPC) method.

The epoxy equivalent of the epoxy resin is preferably 50 to 3,000, more preferably 80 to 2,000, and further preferably 110 to 1,000. By setting the epoxy equivalent within this range, the crosslinking density of the cured product becomes sufficient and the insulating layer having small surface roughness can be obtained. The epoxy equivalent can be measured in accordance with JIS K 7236 and it means the mass of a resin containing one equivalent of epoxy groups.

Curing Agent

The curing agent is not particularly limited as long as it has a function of curing the epoxy resin, and the examples may include a phenol-based curing agent, a naphthol-based curing agent, an active ester-based curing agent, a benzoxazine-based curing agent, a cyanate ester-based curing agent, and a carbodiimide-based curing agent. The curing agents may be used singly or in combination of two or more of them.

As the phenol-based curing agent and the naphthol-based curing agent, a phenol-based curing agent having a novolac structure or a naphthol-based curing agent having a novolac structure is preferable from the viewpoint of heat resistance and water resistance. A nitrogen-containing phenol-based curing agent is preferable and a triazine skeleton-containing phenol-based curing agent is more preferable from the viewpoint of adhesion to the conductor layer. Among them, the triazine skeleton-containing phenol novolak resin is preferable from the viewpoint of highly satisfying heat resistance, water resistance, and adhesion (peeling strength) to the conductor layer.

Specific examples of the phenol-based curing agent and the naphthol-based curing agent may include "MEH-7700", "MEH-7810", and "MEH-7851" manufactured by Meiwa Plastic Industries, Ltd., "NHN", "CBN", and "GPH" manufactured by Nippon Kayaku Co., Ltd., "SN-170", "SN-180", "SN-190", "SN-475", "SN-485", "SN-495", "SN-375", and "SN-395" manufactured by Tohto Kasei Co., Ltd., and "LA-7052", "LA-7054", and "LA-3018" manufactured by DIC Corporation.

The active ester-based curing agent is not particularly limited, and generally compounds each having two or more highly reactive ester groups such as phenol esters, thiophenol esters, N-hydroxyamine esters, and esters of heterocyclic hydroxy compounds in one molecule are preferably used. The active ester-based curing agent is preferably obtained by the condensation reaction of a carboxylic acid compound and/or a thiocarboxylic acid compound with a hydroxy compound and/or a thiol compound. In particular, an active ester-based curing agent obtained from a carboxylic acid compound and a hydroxy compound is preferable, and an active ester-based curing agent obtained from a carboxylic acid compound and a phenol compound and/or a naphthol compound is more preferable from the viewpoint of improving heat resistance. Examples of the carboxylic acid compound may include benzoic acid, acetic acid, succinic acid, maleic acid, itaconic acid, phthalic acid, isophthalic acid, terephthalic acid, and pyromellitic acid. Examples of the phenol compound and the naphthol compound may include hydroquinone, resorcin, bisphenol A, bisphenol F, bisphenol S, phenolphthalein, methylated bisphenol A, methylated bisphenol F, methylated bisphenol S, phenol, o-cresol, m-cresol, p-cresol, catechol, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzenetriol, a dicyclopentadiene type diphenol compound, and phenol novolac. Here, the "dicyclopentadiene type diphenol compound" means a diphenol compound obtained by condensing two molecules of phenol with one molecule of dicyclopentadiene.

Specifically, an active ester compound comprising a dicyclopentadiene type diphenol structure, an active ester compound comprising a naphthalene structure, an active ester compound including an acetylated compound of phenol novolac, and an active ester compound including a benzoylated compound of phenol novolak are preferable. Among them, the active ester compound comprising a naphthalene structure and the active ester compound comprising a dicyclopentadiene type diphenol structure are more preferable. The "dicyclopentadiene type diphenol structure" means a divalent structure unit formed of a phenylene group, a dicyclopentalene group, and a phenylene group linked in this order.

Examples of commercially available products of the active ester-based curing agent may include "EXB9451", "EXB9460", "EXB9460S", and "HPC-8000-65T" (manufactured by DIC Corporation) as active ester compounds comprising a dicyclopentadiene type diphenol structure, "EXB9416-70BK" (manufactured by DIC Corporation) as an active ester compound comprising a naphthalene structure, "DC808" (manufactured by Mitsubishi Chemical Corporation) as an active ester compound including an acetylated compound of phenol novolac, and "YLH1026" (manufactured by Mitsubishi Chemical Corporation) as an active ester compound including a benzoylated compound of phenol novolac.

Specific examples of the benzoxazine-based curing agent may include "HFB2006M" manufactured by Showa Highpolymer Co., Ltd., and "P-d" and "F-a" manufactured by Shikoku Chemicals Corporation.

Examples of the cyanate ester-based curing agent may include: bifunctional cyanate resins such as bisphenol A dicyanate, polyphenol cyanate, oligo(3-methylene-1,5-phenylene cyanate), 4,4'-methylenebis(2,6-dimethylphenyl cyanate), 4,4'-ethylidenediphenyl dicyanate, hexafluorobisphenol A dicyanate, 2,2-bis(4-cyanate)phenylpropane, 1,1-bis(4-cyanatephenylmethane), bis(4-cyanate-3,5-dimethylphenyl)methane, 1,3-bis(4-cyanatephenyl-1-(methylethylidene))benzene, bis (4-cyanatephenyl) thioether, bis (4-cyanatephenyl) ether; polyfunctional cyanate resins derived from phenol novolac, cresol novolac, and the like; and prepolymers in which a part of these cyanate resins is triazinated. Specific examples of the cyanate ester-based curing agent may include "PT30" and "PT60" (both are phenol novolak type polyfunctional cyanate ester resins) and "BA230" (a prepolymer in which a part of or whole of bisphenol A dicyanate is triazinated to form a trimer) manufactured by Lonza Japan Co., Ltd.

Specific examples of the carbodiimide-based curing agent may include "V-03" and "V-07" manufactured by Nisshinbo Chemical Inc.

The ratio of the epoxy resin and the curing agent is preferably in a range of 1:0.2 to 1:2, more preferably 1:0.3 to 1:1.5, and further preferably 1:0.4 to 1:1.2 in a ratio of (Total number of epoxy groups in epoxy resin) (Total number of reactive groups in curing agent). Here, the reactive group of the curing agent means an active hydroxy group, an active ester group, or the like, and it varies depending on the type of the curing agent. The total number of the epoxy groups in the epoxy resin means a value obtained by totaling values obtained by dividing the mass of the nonvolatile components of each epoxy resin by the epoxy equivalent for all of the epoxy resins, and the total number of the reactive groups of the curing agent is a value obtained by totaling values obtained by dividing the mass of the nonvolatile component of each curing agent by the reactive group equivalent for all of the curing agents. By setting the amount ratio of the epoxy resin and the curing agent within such a range, the heat resistance of the cured product of the resin composition layer is further improved.

In one embodiment, the resin composition comprises the above-described inorganic filler, epoxy resin, and curing agent. The resin composition preferably comprises silica as the inorganic filler, the liquid epoxy resin and the solid epoxy resin as the epoxy resin (a mass ratio of liquid epoxy resin:solid epoxy resin is preferably 1:0.1 to 1:5, more preferably 1:0.3 to 1:4, further preferably 1:0.6 to 1:3, and still further preferably 1:0.8 to 1:2.5), and one or more curing agents selected from the group consisting of the phenol-based curing agent, the naphthol-based curing agent, the active ester-based curing agent, and the cyanate ester-based curing agent as the curing agent (preferably one or more curing agents selected from the group consisting of the phenol-based curing agent, the naphthol-based curing agent, and the active ester-based curing agent). With regard to the resin composition comprising the specific components in combination, the suitable contents of the inorganic filler, the epoxy resin, and the curing agent are as described above. In particular, the resin composition preferably has a content of the inorganic filler of 50% by mass to 95% by mass and a content of the epoxy resin of 3% by mass to 50% by mass, and more preferably has a content of the inorganic filler of 50% by mass to 90% by mass and a content of the epoxy resin of 5% by mass to 45% by mass. The curing agent is contained in such a manner that the ratio of the total number of the epoxy groups of the epoxy resin to the total number of the reactive groups of the curing agent is preferably in a range of 1:0.2 to 1:2, more preferably in a range of 1:0.3 to 1:1.5, and further preferably in a range of 1:0.4 to 1:1.2.

Thermoplastic Resin

The resin composition may further comprise a thermoplastic resin. Examples of the thermoplastic resin may include a phenoxy resin, a polyvinyl acetal resin, a polyolefin resin, a polybutadiene resin, a polyimide resin, a polyamideimide resin, a polyether sulfone resin, a polyphenylene ether resin, and a polysulfone resin. The thermoplastic resins may be used singly or in combination of two or more of them.

The weight average molecular weight of the thermoplastic resin in terms of polystyrene is preferably in a range of 8,000 to 70,000, more preferably in a range of 10,000 to 60,000, and further preferably in a range of 20,000 to 60,000. The weight average molecular weight of the thermoplastic resin in terms of polystyrene is measured by a gel permeation chromatography (GPC) method. Specifically, the weight average molecular weight of the thermoplastic resin in terms of polystyrene is measured with LC-9A/RID-6A as a measuring apparatus manufactured by Shimadzu Corporation, Shodex K-800P/K-804L/K-804L as columns manufactured by SHOWA DENKO K. K., and chloroform or the like as a mobile phase at a column temperature of 40° C. and calculated using the calibration curve of the standard polystyrene.

Examples of the phenoxy resin may include phenoxy resins having one or more types of skeletons selected from the group consisting of a bisphenol A skeleton, a bisphenol F skeleton, a bisphenol S skeleton, a bisphenol acetophenone skeleton, a novolak skeleton, a biphenyl skeleton, a fluorene skeleton, a dicyclopentadiene skeleton, a norbornene skeleton, a naphthalene skeleton, an anthracene skeleton, an adamantane skeleton, a terpene skeleton, and a trimethylcyclohexane skeleton. The terminal of the phenoxy resin may be any functional group such as a phenolic hydroxy group and an epoxy group. The phenoxy resins may be used singly or in combination of two or more of them. Specific examples of the phenoxy resin may include "1256"

and "4250" (both are bisphenol A skeleton-containing phenoxy resins), "YX8100" (a bisphenol S skeleton-containing phenoxy resin), and "YX6954" (a bisphenolacetophenone skeleton-containing phenoxy resin) manufactured by Mitsubishi Chemical Corporation. Other examples may include "FX280" and "FX293" manufactured by Tohto Kasei Co., Ltd., and "YX7553", "YX7553BH30", "YL6794", "YL7213", "YL7290", and "YL7482" manufactured by Mitsubishi Chemical Corporation.

Specific examples of the polyvinyl acetal resin may include "Denka Butyral 4000-2", "5000-A", "6000-C", and "6000-E" manufactured by Denka Company Limited, and "S-LEC BH" series, BX series", "KS series" (for example, KS-1), "BL series", and "BM series" manufactured by Sekisui Chemical Co., Ltd.

Specific examples of the polyimide resin may include "RIKACOAT SN20" and "RIKACOAT PN20" manufactured by New Japan Chemical Co., Ltd. Specific examples of the polyimide resin may also include modified polyimides such as a linear polyimide obtained by reacting a bifunctional hydroxy group-terminated polybutadiene, a diisocyanate compound, and a tetrabasic acid anhydride (refer to Japanese Patent Application Laid-open No. 2006-37083, which is incorporated herein by reference in its entirety), and a polysiloxane skeleton-containing polyimide (refer to Japanese Patent Application Laid-open Nos. 2002-12667 and 2000-319386, which is incorporated herein by reference in its entirety).

Specific examples of the polyamideimide resin may include "Vylomax HR11NN" and "Vylomax HR16NN" manufactured by Toyobo Co., Ltd. Specific examples of the polyamideimide resin may include also modified polyamideimides such as polysiloxane skeleton-containing polyamideimides "KS9100" and "KS9300" manufactured by Hitachi Chemical Co., Ltd.

Specific examples of the polyethersulfone resin may include "PES5003P" manufactured by Sumitomo Chemical Co., Ltd.

Specific examples of the polysulfone resin may include Polysulfone "P1700" and "P3500" manufactured by Solvay Advanced Polymers LLC.

The content of the thermoplastic resin in the resin composition is preferably 0.1% by mass to 20% by mass. By setting the content of the thermoplastic resin within the range, the viscosity of the resin composition becomes appropriate and a resin composition having uniform thickness and uniform bulk properties can be formed. The content of the thermoplastic resin in the resin composition is more preferably 0.3% by mass to 10% by mass.

Curing Accelerator

The resin composition may further comprise a curing accelerator. Examples of the curing accelerator may include a phosphorus-based curing accelerator, an amine-based curing accelerator, an imidazole-based curing accelerator, and a guanidine-based curing accelerator. The phosphorus-based curing accelerator, the amine-based curing accelerator, and the imidazole-based curing accelerator are preferable. The curing accelerator may be used singly or in combination of two or more of them.

Examples of the phosphorus-based curing accelerator may include triphenylphosphine, a phosphonium borate compound, tetraphenylphosphonium tetraphenylborate, n-butylphosphonium tetraphenylborate, tetrabutylphosphonium decanoate, (4-methylphenyl)triphenylphosphonium thiocyanate, tetraphenylphosphonium thiocyanate, and butyltriphenylphosphonium thiocyanate. Triphenylphosphine and tetrabutylphosphonium decanoate are preferable.

Examples of the amine-based curing accelerator may include trialkylamines such as triethylamine and tributylamine, 4-dimethylaminopyridine, benzyldimethylamine, 2,4,6,-tris(dimethylaminomethyl)phenol, and 1,8-diazabicyclo (5, 4, 0)-undecene. 4-Dimethylaminopyridine and 1,8-diazabicyclo(5, 4, 0)-undecene are preferable.

Examples of the imidazole-based curing accelerator may include imidazole compounds such as 2-methylimidazole, 2-undecylimidazole, 2-heptadecylimidazole, 1,2-dimethylimidazole, 2-ethyl-4-methylimidazole, 1,2-dimethylimidazole, 2-ethyl-4-methylimidazole, 2-phenylimidazole, 2-phenyl-4-methylimidazole, 1-benzyl-2-methylimidazole, 1-benzyl-2-phenylimidazole, 1-cyanoethyl-2-methylimidazole, cyanoethyl-2-undecylimidazole, 1-cyanoethyl-2-ethyl-4-methylimidazole, 1-cyanoethyl-2-phenylimidazole, 1-cyanoethyl-2-undecylimidazolium trimellitate, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, a 2,4-diamino-6-[2'-methylimidazolyl-(1')]-ethyl-s-triazine isocyanuric acid adduct, a 2-phenylimidazole isocyanuric acid adduct, 2-phenyl-4,5-dihydroxymethylimidazole, 2-phenyl-4-methyl-5-hydroxymethylimidazole, 2,3-dihydro-1H-pyrrolo[1,2-a]benzimidazole, 1-dodecyl-2-methyl-3-benzylimidazolium chloride, 2-methylimidazoline, and 2-phenylimidazoline; and an adduct of an imidazole compound and an epoxy resin. 2-Ethyl-4-methylimidazole and 1-benzyl-2-phenylimidazole are preferable.

Examples of the guanidine-based curing accelerator may include dicyandiamide, 1-methylguanidine, 1-ethylguanidine, 1-cyclohexylguanidine, 1-phenylguanidine, 1-(o-tolyl) guanidine, dimethylguanidine, diphenylguanidine, trimethylguanidine, tetramethylguanidine, pentamethylguanidine, 1,5,7-triazabicyclo[4.4.0]dec-5-ene, 7-methyl-1,5,7-triazabicyclo[4.4.0]dec-5-ene, 1-methylbiguanide, 1-ethylbiguanide, 1-n-butylbiguanide, 1-n-octadecylbiguanide, 1,1-dimethylbiguanide, 1,1-diethylbiguanide, 1-cyclohexylbiguanide, 1-allylbiguanide, 1-phenylbiguanide, and 1-(o-tolyl)biguanide. Dicyandiamide and 1,5,7-triazabicyclo[4.4.0]dec-5-ene are preferable.

The content of the curing accelerator in the resin composition is not particularly limited and is preferably 0.05% by mass to 3% by mass when the total amount of the nonvolatile components of the epoxy resin and the curing agent are determined to be 100% by mass.

Other Components

The resin composition may comprise additives as other components, if necessary. Examples of the additives may include organometallic compounds such as organocopper compounds, organozinc compounds, and organocobalt compounds, organic fillers such as rubber particles, and resin additives such as thickeners, defoaming agents, leveling agents, adhesion imparting agents, flame retardants, and coloring agents.

The minimum melt viscosity of the resin composition layer according to the present invention is not particularly limited and is preferably 300 poise or more, more preferably 500 poise or more, 700 poise or more, 900 poise or more, or 1,000 poise or more from the viewpoint of reducing exudation of the resin composition. The upper limit of the minimum melt viscosity of the resin composition layer is preferably 20,000 poises or less, more preferably 10,000 poises or less, further preferably 8,000 poises or less, 7,000 poises or less, 6,000 poises or less, 5,000 poise or less, or 4,000 poise or less from the viewpoint of achieving excellent laminating properties.

In order to form further finer wirings, higher embeddability is required. In order to improve the embeddability, lowering the minimum melt viscosity of the resin composition is effective. However, lowering the minimum melt viscosity increases the amount of exudation of the resin composition. It can be said that formation of the raised part due to expansion of the support becomes more significant when the amount of exudation of the resin composition is increased. However, in the resin composition layer according to the present invention, even when the resin composition layer has a relatively low minimum melt viscosity which may form the raised part more easily, that is, even when the minimum melt viscosity is 4,000 poise or less, or furthermore 3,400 poise or less, the formation of the raised part can be effectively reduced and the yield of the printed wiring board having excellent embeddability can be further improved.

Under the heating conditions "temperature is raised from 20° C. to 100° C. at a rate of temperature rise of 8° C./min and heating is carried out at 100° C. for 30 minutes, and thereafter the temperature is raised to 180° C. at a rate of temperature rise of 8° C./min and heating is carried out at 180° C. for 30 minutes" described above, the raised part thus formed can be flattened in a self-alignment manner by melting the resin composition when the insulating layer is formed by curing. Therefore, the minimum melt viscosity of the resin composition layer is preferably 10,000 poises or less when the expansion coefficient of the support in the TD direction is 0(%) or less, and minimum melt viscosity of the resin composition layer is preferably 10,000 poise or less when the expansion coefficient of the support in the MD direction is 0(%) or less. The minimum melt viscosity of the resin composition layer is more preferably 8,000 poises or less when the expansion coefficient of the support in the TD direction is 0(%) or less, and minimum melt viscosity of the resin composition layer is more preferably 8,000 poise or less when the expansion coefficient of the support in the MD direction is 0(%) or less. The minimum melt viscosity of the resin composition layer is further preferably 4,000 poises or less when the expansion coefficient of the support in the TD direction is 0(%) or less, and minimum melt viscosity of the resin composition layer is further preferably 4,000 poise or less when the expansion coefficient of the support in the MD direction is 0(%) or less.

The "minimum melt viscosity" of the resin composition layer means a minimum viscosity exhibited by the resin composition layer when the resin of the resin composition layer is melted. In detail, when the resin composition layer is heated at a constant rate of temperature rise to melt the resin, the melt viscosity decreases with an increase in temperature at the initial stage. Thereafter, when the temperature exceeds a certain level, the melt viscosity increases with temperature rise. The "minimum melt viscosity" means the melt viscosity of such a local minimum point. The minimum melt viscosity and the minimum melt viscosity temperature of the resin composition layer can be measured by a dynamic viscoelasticity method.

The thickness of the resin composition layer is not particularly limited and is preferably 5 µm to 100 µm, more preferably 10 µm to 90 µm, and further preferably 15 µm to 80 µm from the viewpoint of thinning the printed wiring board.

In the present invention, the expansion coefficient of the support at less than 120° C. is not particularly limited, and the support may have a certain expansion coefficient exceeding 0% on condition that the object of the present invention is not impaired. This is because even if the support expands at a temperature less than 120° C. to form a raised part, the formed raised part can be flattened in a self-aligned manner by melting the resin composition layer when the expansion coefficient of the support becomes 0% or less later. In order to obtain this self-aligning flattening effect, however, the expansion coefficient at less than 120° C. is preferably 2% or less.

The adhesive sheet can be produced by, for example, preparing a resin varnish by dissolving a resin composition in an organic solvent, applying the resin varnish onto the support using a die coater or the like, and drying the applied resin varnish to form a resin composition layer.

Examples of the organic solvent may include: ketones such as acetone, methyl ethyl ketone (MEK), and cyclohexanone; acetic acid esters such as ethyl acetate, butyl acetate, cellosolve acetate, propylene glycol monomethyl ether acetate, and carbitol acetate; carbitols such as cellosolve and butyl carbitol; aromatic hydrocarbons such as toluene and xylene; and amide solvents such as dimethylformamide, dimethylacetamide, and N-methylpyrrolidone. The organic solvents may be used singly or in combination of two or more of them.

The drying may be carried out by a known method such as heating or hot air blowing. Drying conditions are not particularly limited and the drying is carried out so that the content (residual solvent amount) of the organic solvent in the resin composition layer is 10% by mass or less and preferably 5% by mass or less. From the viewpoint of improving the handleability of the resin composition layer and preventing an increase in the melt viscosity when the resin composition is formed into an adhesive sheet, the residual solvent amount is preferably 0.5% by mass or more, more preferably 1% by mass or more. Depending on the boiling point of the organic solvent in the resin varnish, when a resin varnish containing, for example, 30% by mass to 60% by mass of the organic solvent is used, the resin composition layer can be formed by drying at 50° C. to 150° C. for 3 minutes to 10 minutes.

In the adhesive sheet, a protection film that is a film similar to the support described above can be further laminated on the surface of the resin composition layer not bonded to the support of the resin composition layer (that is, the surface opposite to the support). The thickness of the protection film is not particularly limited and is, for example, 1 µm to 40 µm. Lamination of the protection film serves to prevent adhesion of dust and the like and scratches to the surface of the resin composition layer. The adhesive sheet can be rolled up and stored. In manufacturing of the printed wiring board, the adhesive sheet can be used by peeling off the protection film.

Method for Manufacturing Printed Wiring Board

The method for manufacturing the printed wiring board of the present invention comprises Steps (A) to (C) in this order:

Step (A) of laminating an adhesive sheet comprising a support and a resin composition layer bonded to the support to an inner layer board so that the resin composition layer is bonded to the inner layer board;

Step (B) of thermally curing the resin composition layer to form an insulating layer; and Step (C) of removing the support, the support preferably satisfies the following condition (MD1) and condition (TD1) when it is heated under the following heating conditions.

Heating conditions: temperature is raised from 20° C. to 100° C. at a rate of temperature rise of 8° C./min and heating is carried out at 100° C. for 30 minutes, and thereafter the temperature is raised to 180° C. at a rate of temperature rise of 8° C./min and heating is carried out at 180° C. for 30 minutes.

Condition (MD1): a maximum expansion coefficient $E_{MD}$ (%) in an MD direction at 120° C. or more is less than 0.2%.

Condition (TD1): a maximum expansion coefficient $E_{TD}$ (%) in a TD direction at 120° C. or more is less than 0.2%.

In the method for manufacturing a printed wiring board, the support more preferably satisfies the following condition (MD2) and condition (TD2).

Condition (MD2): the maximum expansion coefficient $E_{MD}$ (%) in the MD direction at 100° C. or more is less than 0%.

Condition (TD2: the maximum expansion coefficient $E_{TD}$ (%) in the TD direction at 100° C. or more is less than 0%.

Further, a method for manufacturing a printed wiring board preferably Steps (A) to (C):

Step (A) of laminating an adhesive sheet comprising a support and a resin composition layer bonded to the support to an inner layer board so that the resin composition layer is bonded to the inner layer board;

Step (B) of thermally curing the resin composition layer to form an insulating layer; and Step (C) of removing the support, in this order, wherein the support preferably satisfies the following condition (MD3) and condition (TD3) when it is heated under the following heating conditions.

Heating conditions: temperature is raised from 20° C. to 100° C. at a rate of temperature rise of 8° C./min and heating is carried out at 100° C. for 30 minutes, and thereafter the temperature is raised to 180° C. at a rate of temperature rise of 8° C./min and heating is carried out at 180° C. for 30 minutes.

Condition (MD3): a temperature at which an expansion coefficient in an MD direction becomes maximum is less than 120° C.

Condition (TD3): a temperature at which an expansion coefficient in a TD direction becomes maximum is less than 120° C.

In Step (B), the support preferably satisfies

Condition (MD4): a temperature at which the expansion coefficient of the support in the MD direction becomes maximum is less than 120° C. and Condition (TD4): a temperature at which the expansion coefficient of the support in the TD direction becomes maximum is less than 120° C.

In the heating condition of the method for manufacturing a printed wiring board described above, the minimum melt viscosity of the resin composition layer is preferably 10,000 poises or less when the expansion coefficient of the support in the TD direction is 0(%) or less, and minimum melt viscosity of the resin composition layer is preferably 10,000 poise or less when the expansion coefficient of the support in the MD direction is 0(%) or less.

In the present invention, the phrase "comprise in this order" in any of Step (A) to Step (C) means that other step may be comprised as long as the method comprises each step of Step (A) to Step (C) and each step of Step (A) to Step (C) is carried out in this order.

Hereinafter, the phrase "comprise in this order" in any steps or procedures has the same meaning.

Step (A)

In Step (A), an adhesive sheet comprising a support and a resin composition layer bonded to the support is laminated to an inner layer board so that the resin composition layer is bonded to the inner layer board.

The adhesive sheet used in Step (A) is as described in the above "Adhesive sheet". As described above, the adhesive sheet comprises the support satisfying the condition (MD1) and the condition (TD1), the condition (MD2) and the condition (TD2), or the condition (MD3) and the condition (TD3), or satisfying the condition (MD4) and the condition (TD4) at the time of heating under the heating conditions (Heating conditions).

The "inner layer board" used in Step (A) mainly means a board such as a glass epoxy board, a metal board, a polyester board, a polyimide board, a BT resin board, and a thermoset type polyphenylene ether board or a circuit board with which a patterned conductor layer (a circuit) is formed on one surface or both surfaces of the above-described board. A laminated structure that is an intermediate product onto which an insulating layer and/or a conductor layer is to be further formed at the time of manufacturing the printed wiring board is also comprised in the "inner layer board" of the present invention.

Lamination (bonding) of the inner layer board and the adhesive sheet can be carried out by, for example, thermally compressing and bonding the adhesive sheet to the inner layer board from the support side. Examples of members for thermally compressing and bonding the adhesive sheet to the inner layer board (hereinafter also referred to as "thermally compressing and bonding member") may include a heated metal plate (SUS mirror plate or the like) and a metal roll (SUS roll). Here, it is preferable that the thermally compressing and bonding member is not pressed directly on the adhesive sheet but is pressed through an elastic material such as heat resistant rubber so that the adhesive sheet sufficiently follows the surface unevenness of the inner layer board.

Temperature at the time of thermal compressing and bonding is preferably in a range of 80° C. to 160° C., more preferably in a range of 90° C. to 140° C., and further preferably in a range of 100° C. to 120° C. Pressure at the time of the thermal compressing and bonding is preferably in a range of 0.098 MPa to 1.77 MPa and more preferably in a range of 0.29 MPa to 1.47 MPa. The time of the thermal compressing and bonding is preferably in a range of 20 seconds to 400 seconds and more preferably in a range of 30 seconds to 300 seconds. The bonding of the adhesive sheet and the inner layer board is preferably carried out under a reduced pressure condition at a pressure of 26.7 hPa or less.

The bonding of the adhesive sheet and the inner layer board can be carried out with a commercially available vacuum laminator. Examples of the commercially available vacuum laminators may include a vacuum pressurized laminator manufactured by MEIKI CO., LTD. and a vacuum applicator manufactured by Nichigo-Morton Co., Ltd.

For example, after the bonding of the adhesive sheet and the inner layer board, the laminated adhesive sheet may be subjected to smoothing treatment under a normal pressure (under atmospheric pressure) by pressing the thermally compressing and bonding member from the support side. Conditions similar to the thermal compressing and bonding conditions for the lamination can be used for the pressing conditions in the smoothing treatment. The smoothing treatment can be carried out by a commercially available laminator. The lamination and the smoothing treatment may be carried out successively using the commercially available vacuum laminator.

Step (B)

In Step (B), the resin composition layer is thermally cured to form the insulating layer.

The conditions of thermal curing are determined in consideration of the properties of the selected support and the properties of the resin composition layer. Conditions generally employed at the time of forming the insulating layer of the printed wiring board may be applied.

The thermal curing conditions of the resin composition layer vary depending on the composition of the resin composition and, for example, the curing temperature is in a range of 120° C. to 240° C. or 150° C. to 240° C. (preferably 155° C. to 230° C., more preferably 160° C. to 220° C., further preferably 170° C. to 210° C., and further more preferably 180° C. to 200° C.). The curing time is in a range of 5 minutes to 100 minutes (preferably 10 minutes to 80 minutes and more preferably 10 minutes to 50 minutes). The curing conditions also may be determined in consideration of conditions for flattening the resin composition layer in a self-aligned manner by melting. The thermal curing may be carried out under any of the normal pressure, the reduced pressure, and the increased pressure.

Step (B) suitably comprises a step of thermally curing the resin composition layer at a temperature $T_2$ higher than a temperature $T_1$ after heating the resin composition layer at the temperature $T_1$.

In a suitable embodiment, Step (B) comprises
(i) a step of heating the resin composition layer at the temperature $T_1$ (50° C.≤$T_1$<150° C.) and
(ii) a step of thermally curing the resin composition layer at the temperature $T_2$ (150° C.≤$T_2$≤240° C.) after the step of heating.

In the step (i), the temperature $T_1$ preferably satisfies 60° C.≤$T_1$≤130° C., more preferably 70° C.≤$T_1$≤120° C., further preferably 80° C.≤$T_1$≤110° C., and further more preferably 80° C.≤$T_1$≤100° C. although it depends on the composition of the resin composition layer.

Retention time at the temperature $T_1$ is preferably 10 minutes to 150 minutes, more preferably 15 minutes to 120 minutes, and further preferably 20 minutes to 120 minutes, although it depends on the value of the temperature of $T_1$.

The heating in the step (i) may be carried out under the normal pressure, carried out under the reduced pressure, or carried out under the increased pressure, and preferably carried out under a pressure in a range of 0.075 mmHg to 3751 mmHg (0.1 hPa to 5,000 hPa) and more preferably in a range of 1 mmHg to 1875 mmHg (1.3 hPa to 2,500 hPa).

In the step (ii), the temperature $T_2$ preferably satisfies 155° C.≤$T_2$≤230° C., more preferably 160° C.≤$T_2$≤220° C., further preferably 170° C.≤$T_2$≤210° C., and further more preferably 180° C.≤$T_2$≤200° C., although it depends on the composition of the resin composition layer.

The temperature $T_1$ and the temperature $T_2$ preferably satisfy the relation of 20° C.≤$T_2-T_1$≤150° C., more preferably 30° C.≤$T_2-T_1$≤140° C., further preferably 40° C.≤$T_2-T_1$≤130° C., and particularly preferably 50° C.≤$T_2-T_1$≤120° C.

Time for thermal curing is preferably 5 minutes to 100 minutes, more preferably 10 minutes to 80 minutes, and further preferably 10 minutes to 50 minutes, although it depends on the value of the temperature of $T_2$.

The thermal curing in the step ii) may be carried out under the normal pressure, the reduced pressure, and the increased pressure. The thermal curing is preferably carried out under a pressure similar to the pressure in the heating step.

After the heating in the step i), the resin composition layer may be allowed to radiate heat once and then the thermal curing of the step ii) may be carried out. Alternatively, after the heating in the step i), the thermal curing may be carried out in the step ii) without heat radiation from the resin composition layer. In a preferable embodiment, Step (B) further comprises a step of raising temperature from the temperature $T_1$ to the temperature $T_2$ between the heating in the step i) and the thermal curing in the step ii). In such an embodiment, the rate of temperature rise from the temperature $T_1$ to the temperature $T_2$ is preferably 1.5° C./min to 30° C./min, more preferably 2° C./min to 30° C./min, further preferably 4° C./min to 20° C./min, further more preferably from 4° C./min to 10° C./min. Thermal curing of the resin composition layer may be started during the temperature rise.

Step (C)

In Step (C), the support is removed.

The support can be removed by peeling by a conventionally known and appropriately suitable method, and it may be removed by peeling using an automatic peeling device. By carrying out this Step (C), the surface of the formed insulating layer is exposed.

At the time of manufacturing the printed wiring board, Step (D) of drilling the insulating layer, Step (E) of roughening the insulating layer, and Step (F) of forming the conductor layer on the surface of the insulating layer may be further carried out. These Steps (D) to (F) may be carried out in accordance with various methods known to those skilled in the art used for manufacturing printed wiring boards.

Step (D) is a step of drilling the insulating layer, whereby holes such as via holes and through holes can be formed in the insulating layer. The drilling step may be carried out using, for example, a drill, laser (carbon dioxide gas laser, YAG laser, and the like), plasma, or the like. Step (D) may be carried out between Step (B) and Step (C) or may be carried out after Step (C).

Step (E) is a step of roughening the insulating layer. The procedures and conditions of the roughening treatment is not particularly limited and known procedures and conditions generally used for forming the insulating layer of the printed wiring board can be employed. Step (E) can be a step of roughening the insulating layer by carrying out the roughening treatment by, for example, swelling treatment with a swelling liquid, roughening treatment with an oxidizing agent, and neutralization treatment with a neutralizing liquid in this order. The swelling liquid is not particularly limited. Examples of the swelling liquid may include an alkaline solution and a surfactant solution. The alkaline solution is preferable, and a sodium hydroxide solution and a potassium hydroxide solution are more preferable as the alkaline solution. Examples of the commercially available swelling liquid may include "Swelling Dip Securiganth P" and "Swelling Dip Securiganth SBU" manufactured by Atotech Japan K. K. The swelling treatment with the swelling liquid is not particularly limited and can be carried out by, for example, immersing the insulating layer into a swelling liquid at 30° C. to 90° C. for 1 minute to 20 minutes. The oxidizing agent is not particularly limited. Examples of the oxidizing agent may include an alkaline permanganic acid solution prepared by dissolving potassium permanganate or sodium permanganate in an aqueous solution of sodium hydroxide. The roughening treatment with the oxidizing agent such as the alkaline permanganic acid solution is preferably carried out by immersing the insulating layer in the oxidizing agent solution heated to 60° C. to 80° C. for 10 minutes to 30 minutes. The concentration of a permanganate salt in the alkaline permanganate solution is preferably 5% by mass to 10% by mass. Examples of commercially available oxidizing agents may include alkaline permanganic acid solutions such as "Concentrate Compact CP" and "Dosing Solution Securiganth P" manufactured by Atotech Japan K, K. As the neutralizing liquid, an acidic aqueous solution is preferable. Examples of commercially available products may include "Reduction Solution Securiganth P" manufactured by Atotech Japan K. K. Treatment with the neutralizing liquid can be carried out by immersing the treated surface subjected to the roughening treatment with the oxidizing agent solution into the neutralizing liquid at 30° C. to 80° C. for 5 minutes to 30 minutes.

Step (F) is a step of forming a conductor layer on the surface of the insulating layer.

The conductor material used for the conductor layer is not particularly limited. In a preferable embodiment, the conductor layer comprises one or more metals selected from the group consisting of gold, platinum, palladium, silver, copper, aluminum, cobalt, chromium, zinc, nickel, titanium, tungsten, iron, tin, and indium. The conductor layer may be a single metal layer or an alloy layer. Examples of the alloy layer may include a layer formed of an alloy of two or more metals selected from the above group (for example, a nickel-chromium alloy, a copper-nickel alloy, and a copper-titanium alloy). Among them, from the viewpoints of easy formation of the conductor layer, cost and easy patterning, the single metal layer of chromium, nickel, titanium, aluminum, zinc, gold, palladium, silver, or copper or the alloy layer of a nickel-chromium alloy, a copper-nickel alloy, or a copper-titanium alloy is preferable, the single metal layer of chromium, nickel, titanium, aluminum, zinc, gold, palladium, silver, or copper or the alloy layer of a nickel-chromium alloy is more preferable, and the single metal layer of copper is further preferable.

The conductor layer may have a single layer structure or a multilayer structure formed by laminating two or more layers of single metal layers or alloy layers made of different types of metals or alloys. When the conductor layer has a multilayer structure, the layer in contact with the insulating layer is preferably the single metal layer of chromium, zinc, or titanium or the alloy layer of nickel-chromium alloy.

The thickness of the conductor layer is generally 3 μm to 35 μm and preferably 5 μm to 30 μm, depending on the design of the desired printed wiring board.

The conductor layer may be formed by plating. For example, the conductor layer having a desired wiring pattern can be formed by plating the surface of the insulating layer by a conventionally known technique such as a semi-additive method and a full additive method. Hereinafter, the example of formation of the conductor layer by the semi-additive method will be described.

First, a plating seed layer is formed on the surface of the insulating layer by electroless plating. Subsequently, a mask pattern for exposing a part of the plating seed layer corresponding to a desired wiring pattern is formed on the formed plating seed layer. A metal layer is formed on the exposed plating seed layer by electrolytic plating, and thereafter the mask pattern is removed. Thereafter, the unnecessary plating seed layer is removed by etching or the like. Thus, the conductor layer having a desired wiring pattern can be formed.

Semiconductor Device

By using the printed wiring board obtained by the manufacturing method of the present invention, a semiconductor device comprising such a printed wiring board can be manufactured.

Examples of the semiconductor device may include various semiconductor devices provided for electric products (for example, computers, mobile phones, digital cameras, and televisions) and vehicles (for example, motorcycles, automobiles, trains, ships, and aircraft).

Laminated Structure

The laminated structure of the present invention is a laminated structure comprising the inner layer board, an insulating layer provided on the inner layer board, and a support bonded to the insulating layer. When the thickness of the central part of the insulating layer is determined to be t (μm), the thickness of the insulating layer including the raised part outside the central part is 2.5t (μm) or less. Here, the thickness preferably satisfies t≤40 (μm).

The laminated structure comprises an inner layer board, an insulating layer provided on the inner layer board, and a support bonded to the insulating layer, in which a difference in height between a lowest point and a highest point is preferably 60 μm or less. At the lowest point, a height of the insulating layer that is a height from an interface between the insulating layer and the inner layer board to an interface where the insulating layer and the support are bonded is the lowest, and at the highest point, the height of the insulating layer is the highest.

The laminated structure of the present invention is a laminated structure comprising an inner layer board, an insulating layer provided on the inner layer board, and a support bonded to the insulating layer, in which the highest point of the raised part of the insulating layer to which the support is bonded is at the position lower than the height of the surface of the support. Here, "the surface of the support" means a surface opposite to the surface where the insulating layer is bonded to the support.

Figure 4:
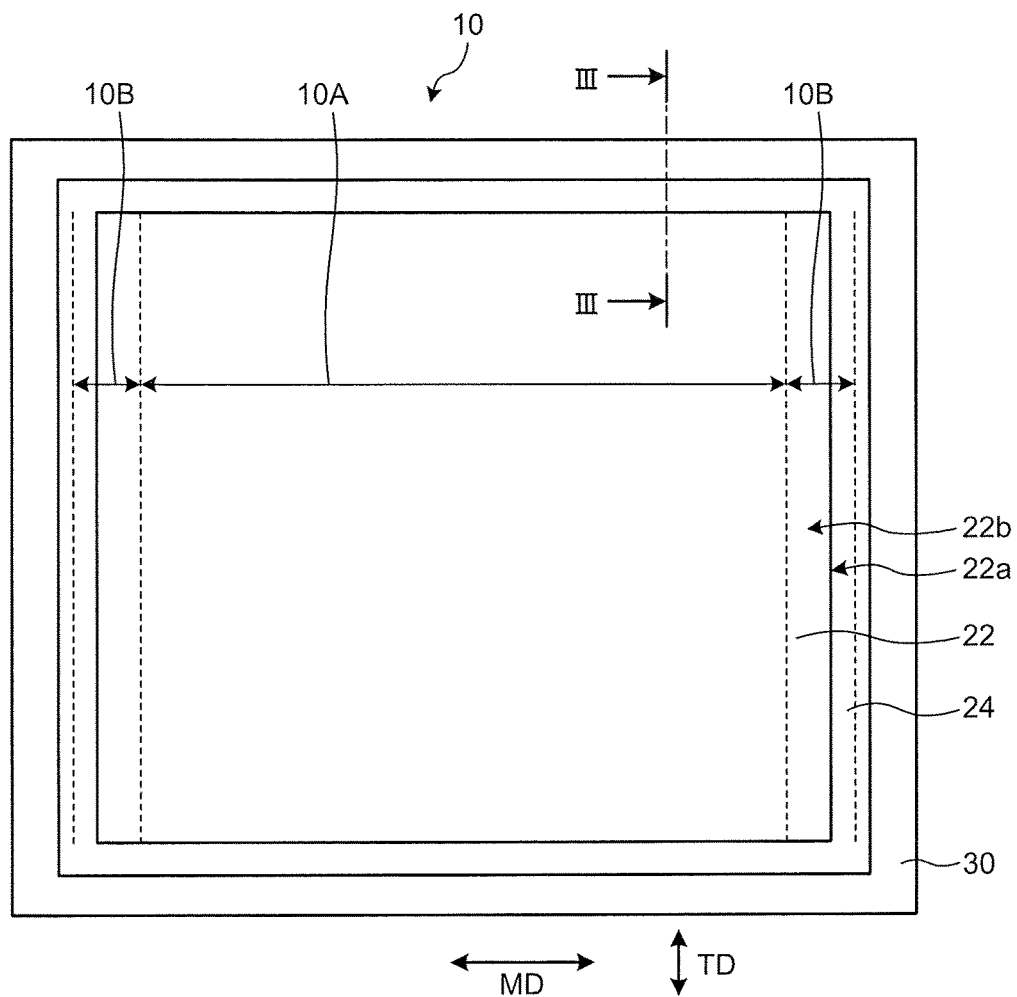
FIG. 4 is a schematic plan view of a laminated structure.
Figure 5:
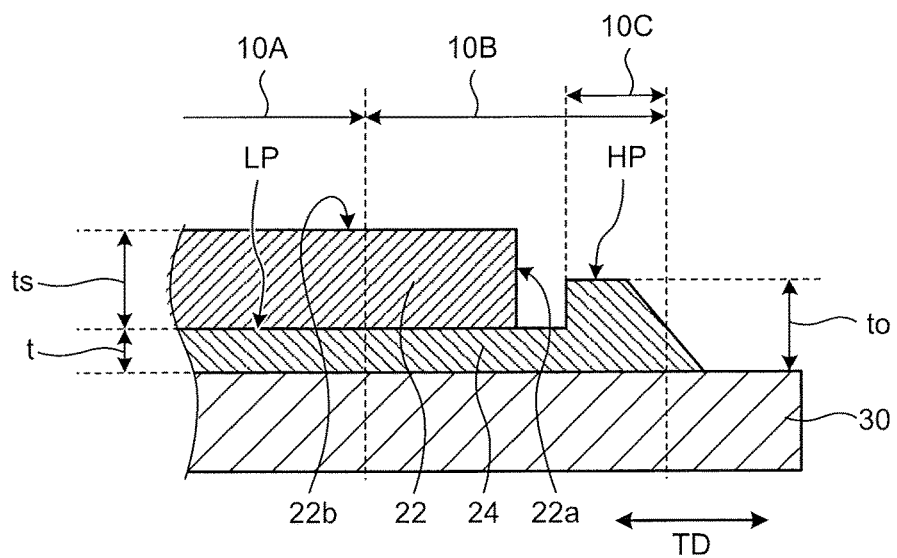
FIG. 5 is a schematic view of a cut end face of the laminated structure.

With reference to FIGS. 4 and 5, a configuration example of the laminated structure of the present invention will be described.

FIG. 4 is a schematic plan view of the laminated structure. FIG. 5 is a schematic view illustrating an end face cut along the position of the dot-and-dash line of the laminated structure in FIG. 4.

As illustrated in FIGS. 4 and 5, a laminated structure 10 has an inner layer board 30, an insulating layer 24 provided on the inner layer board 30, and a support 22 bonded to the insulating layer 24.

In the laminated structure 10, the insulating layer 24 formed on the inner layer board 30 means an insulating layer newly formed with the adhesive sheet described above. The insulating layer 24 in the laminated structure 10 is not limited to only one layer but may include an aspect in which two or more insulating layers 24 are laminated on one surface side of the inner layer board 30. When the laminated structure 10 has two or more insulating layers, at least one of the two or more insulating layers may be formed by the steps of laminating the adhesive sheet comprising the support 22 having the properties described above onto the inner layer board 30, thermally curing the resin composition layer, and thereafter peeling off the support 22 to remove the support 22.

In the laminated structure 10, when the thickness of the insulating layer 24 at the central part 10A of the laminated structure 10 is determined to be t (μm), the thickness of the insulating layer 24 including the raised part 10C outside the central part 10A is 2.5t (μm) or less. Here, the thickness preferably satisfies t≤40 (μm).

The "central part 10A" described here means a region in which the thickness t of the insulating layer 24 overlapping (is overlapped with) the support 22 is substantially uniform when the laminated structure 10 is viewed in the thickness direction from which the region included in the "end part 10B" positioned on both sides in the TD direction is excluded.

The "end part 10B" means a region in which the insulating layer 24 overlaps (is overlapped with) the support 22 when the laminated structure 10 is viewed in the thickness direction and a region including a border between the support 22 and the insulating layer 24 exposed from the support 22 in TD direction, that is, a linear region having a width of about 50 mm from the edge part 22a in the TD direction of the support 22 toward the support 22 side and a region outside the edge part 22a in the TD direction of the support 22 and in the vicinity of the edge part 22a where the raised part 10C may be formed.

The thickness t of the central part 10A of the insulating layer 24 is a distance (height) from the surface of the insulating layer 24 (the interface being the bonding surface with the support 22) to the interface on the member (for example, the inner layer board 30) to which the insulating layer 24 is bonded. When the conductor layer is provided in the inner layer board 30 and particularly the thickness of the insulating layer 24 on the conductor layer is significantly smaller than the thickness of the insulating layer 24 on the surface of the inner layer board 30 where the conductor layer does not exist, the distance may be a distance from the surface of the insulating layer 24 to the surface of the inner layer board 30 where the conductor layer does not exist. When the difference between the thickness of the insulating layer 24 on the conductor layer and the thickness of the insulating layer 24 on the surface of the inner layer board 30 where the conductor layer does not exist is negligibly small, the distance may be a distance from the surface of the insulating layer 24 to the interface with the conductor layer.

The thickness t of the central part 10A of the insulating layer 24 may be any suitable thickness in accordance with the design. The thickness t of the central part 10A of the insulating layer 24 is preferably 40 μm or less, more preferably 10 μm or more and 30 μm or less from the viewpoint of forming a thinner printed wiring board.

At the end part of the conventional insulating layer, the insulating layer is pushed by the support due to the expansion of the support in the thermal curing step in the vicinity of the edge part in the TD direction and in the vicinity of the edge part in the MD direction, so that the insulating layer may run on the support, or a raised part exceeding the thickness of the support may be formed.

In the laminated structure 10 according to the present invention, the raised part 10C does not exist at the end part 10B in the TD direction of the insulating layer 24, or the highest point HP of the raised part 10C of the insulating layer 24 does not exceed the height of the surface 22b of the support 22, in other words, the highest point HP of the raised part 10C of the insulating layer 24 is at a position lower than the height of the surface 22b of the support 22.

Therefore, even when the thickness of the insulating layer 24 at the end part 10B, that is, the thickness $t_0$ of the insulating layer 24 including the raised part 10C may be thicker than the thickness t of the central part 10A due to formation of the raised part 10C, the thickness to may be acceptable when the highest point HP of the raised part 10C is at a position lower than the height of the surface 22b of the support 22.

When the thickness of the support 22 is determined to be $t_s$ and the thickness of the insulating layer 24, that is, the thickness of the central part 10A of the insulating layer 24 is determined to be t (μm), considering the flatness of the insulating layer 24, the thickness $t_0$ of the thickest part (raised part 10C) at the end part 10B of the insulating layer 24 is 2.5t (μm) or less, preferably at most 100 μm, more preferably at most 70 μm. In other words, $t+t_s>t_0$ is preferable. When the height from the interface with the member to which the insulating layer 24 is bonded (for example, the inner layer board) to the surface of the insulating layer 24 (the surface (interface) to be bonded to the support) is determined as a standard, the difference between the heights of the lowest point LP (the central part 10A) having the lowest height of the insulating layer 24 and the highest point HP (the end part 10B) having the highest height of the insulating layer is at most 60 μm, that is, preferably 60 μm or less. The difference is more preferably at most 50 μm, that is, 50 μm or less and further preferably at most 30 μm, that is, 30 μm or less.

The thicknesses t and $t_0$ of the insulating layer 24 can be determined by SEM observation of the cross section in the thickness direction of the insulating layer 24 obtained in Step (C). Examples of focused ion beam/scanning ion microscopes that can be used for SEM observation include "S-4800" manufactured by Hitachi High-Technologies Corporation and "SMI3050SE" manufactured by SII Nanotechnology Co., Ltd.

Other features of the invention will become apparent in the course of the following descriptions of exemplary embodiments which are given for illustration of the invention and are not intended to be limiting thereof.

EXAMPLES

In the following description, "part" and "%" mean "part by mass" and "% by mass", respectively, unless otherwise specified.

First, the method of measurement and evaluation will be described.

Preparation of Sample for Measurement and Evaluation (1) Preparation of Inner Layer Board A glass cloth substrate epoxy resin double-sided copper clad laminate boards ("R1515A", manufactured by Panasonic Electric Works Co., Ltd., thickness of copper layer is 18 μm and thickness of board is 0.8 mm) was prepared as the inner layer board. Both surfaces of the inner layer board were immersed in "CZ8100" manufactured by MEC Co., Ltd. to carry out roughening treatment of the surfaces of the copper layers.

(2) Lamination of Adhesive Sheet

The adhesive sheets prepared in Examples and Comparative Examples below were laminated to both surfaces of the inner layer board using a batch type vacuum pressure laminator ("MVLP-500", manufactured by MEIKI CO., LTD.) so that the resin composition layer is bonded to the inner layer board. The lamination treatment was carried out by depressurizing for 30 seconds to adjust a gas pressure to 13 hPa or less and thereafter compressing and bonding at 100° C. under a pressure of 0.74 MPa for 30 seconds. The adhesive sheet was used after the protection film is peeled off.

(3) Thermal Curing of the Resin Composition Layer

After the lamination of the adhesive sheet, the resin composition layer was thermally cured with the attached support under heating conditions of 100° C. (temperature $T_1$) for 30 minutes and then 180° C. (temperature $T_2$) for 30 minutes to form an insulating layer. The thickness of the obtained insulating layer just above the copper layer was 40 The obtained structure is referred to as an evaluation board A.

(4) Formation of Second Insulating Layer

After the support was peeled off from the evaluation board A obtained in the above (3), an adhesive sheet having the same size as the cured insulating layer was repeatedly laminated and cured in the same manner as in the above (2) and (3) to form a second insulating layer. The total thickness of the first insulating layer and the second insulating layer just above the copper layer was 80 μm. The obtained structure is referred to as an evaluation board B.

Measurement of Expansion Coefficient of Support
Measurement of Expansion Coefficient of Support in TD Direction Rectangular specimens having a size of 20 mm (short side)×4 mm (long side) of the supports prepared in Examples and Comparative Examples described below were cut out so that the TD direction of the supports was in the direction along the long side. Expansion coefficients of the test specimen through the entire process of heat treatment were measured using the thermomechanical analyzer ("TMA-SS6100", manufactured by Seiko Instruments Inc.) in a tensile test mode under the air atmosphere at a tensile load of 9.8 mmN under the following heating conditions. The maximum expansion coefficient $E_{TD}$ at 100° C. or more, the maximum expansion coefficient $E_{TD}$ at 120° C. or more, the maximum expansion coefficient $E_{TD}$ at less than 120° C., and the temperature $T_{TD}$ at which expansion coefficient become negative values from a positive value, in other words, the temperature $T_{TD}$ at which the expansion coefficient becomes 0(%) were determined.

Heating conditions: temperature is raised from 20° C. to 100° C. (temperature $T_1$) at a rate of temperature rise of 8° C./min and heating is carried out at 100° C. for 30 minutes, and thereafter the temperature is raised to 180° C. (temperature $T_2$) at a rate of temperature rise of 8° C./min and heating is carried out at 180° C. for 30 minutes.

Measurement of Expansion Coefficient of Support in MD Direction

Rectangular specimens having a size of 20 mm×4 mm of the supports prepared in Examples and Comparative Examples described below were cut out so that the MD direction of the supports was in the direction along the long side. Similar to "Measurement of expansion coefficient of support in TD direction", for the test specimen, the maximum expansion coefficient $E_{MD}$ at 100° C. or more, the maximum expansion coefficient $E_{MD}$ at 120° C. or more, the maximum expansion coefficient $E_{MD}$ at less than 120° C., and the temperature $T_{MD}$ at which expansion coefficient become negative values from a positive value, in other words, the temperature $T_{MD}$ at which the expansion coefficient becomes 0(%) were determined.

Measurement of Minimum Melt Viscosity

With respect to the resin composition layers of the adhesive sheets prepared in the following Examples and Comparative Examples, the melt viscosities were measured using a dynamic viscoelasticity measuring apparatus ("Rheosol-G3000" manufactured by U-BM Co., Ltd.). The dynamic viscoelasticity was measured under conditions of a measurement temperature interval of 2.5° C., a frequency of 1 Hz, and a strain of 1 deg by using a parallel plate having a diameter of 18 mm for 1 g of the resin composition as a sample and raising a temperature at a temperature rise rate of 5° C./min from an initial temperature of 60° C. to 200° C. to determine the minimum melt viscosity (poise). The minimum melt viscosities (poise) of the resin composition layer at temperatures higher than $T_{TD}$ and $T_{MD}$ were also confirmed.

Measurement of Height of Highest Point of Raised Part

The shape of the end part of the insulating layer was observed according to the following procedure. SEM observation of the cross-sectional surfaces formed by cutting the insulating layer in the TD direction and the MD direction was carried out for the insulating layer raised in the vicinity of the end part in the TD direction and in the vicinity of the end part in the MD direction of the support. The distance (height) from the lowest part of the insulating layer, that is, the surface of the inner layer board to the highest point of the raised part being the surface of the insulating layer was calculated. SEM observation was carried out using "S-4800" manufactured by Hitachi High-Technologies Corporation. The height of the highest point of the raised part was measured for the evaluation boards A and B.

Evaluation of Insulating Layer in the Vicinity of End Part of Support

The observation of the insulating layer in the vicinity of the end part of the support was visually observed in a similar manner to the above SEM observation. With respect to the insulating layer raised in the vicinity of the end parts in the TD direction and in the vicinity of the edge part in the MD direction of the support, the case where the highest point of the part raised (raised part) in the vicinity of each edge part did not exceed the height of the surface of the support was determined to be "Good: ○", whereas the case where the highest point of the raised part exceeded the height of surface of the support or the highest point was above the surface of the support, that is, the insulating layer ran on the surface of the support, was determined to be "Disapproved: ×".

Evaluation of Winkles and Lifting of Support

The wrinkles and lifting of the support were visually observed. The evaluation criteria are as follows.

Evaluation Criteria

Wrinkles and lifting are not generated at the end part of the support after formation of the insulating layer: ○ (Good)

Wrinkles and lifting are generated at the end part of the support after formation of the insulating layer: ×(Disapproved)

Evaluation of Resin Chip Adhesion

Observation of resin chip adhesion generated on the insulating layer in the vicinity of the end part of the support was carried out by peeling off the support and thereafter observing the support with SEM.

Evaluation Criteria

No resin chip adhesion having a height of 5 μm or more exists on the surface in the vicinity of the end part of the support after formation of the insulating layer: ○ (Good)

The resin chip adhesion having a height of 5 μm or more exists on the surface in the vicinity of the end part of the support after formation of the insulating layer: × (Disapproved)

Preheating Conditions

The preheating conditions employed at the time of preparation of the support in the following Examples and Comparative Examples are listed in Table 1 below. In Table 1, "Tension" means a tension applied in the TD direction of the support.

TABLE 1

| | Preheating conditions | | | | | |
|---|---|---|---|---|---|---|
| | 1 | 2 | 3 | 4 | 5 | 6 |
| Heating Temperature (° C.) | 130 | 130 | 130 | 170 | 150 | 130 |
| Heating time (min) | 30 | 30 | 30 | 10 | 30 | 30 |
| Tension (gf/cm$^2$) | 20 | 10 | 5 | 2 | 20 | 20 |

Example 1

(1) Preparation of Support

An alkyd resin-based releasing layer-attached PET film ("AL5", manufactured by Lintec Corporation, thickness 38 µm, hereinafter referred to as "release PET film") was fixed at the edge of one side in the TD direction so that the TD direction of the PET film was in a direction along the vertical direction to suspend the PET film so that a uniform tension was applied to the entire PET film. Thereafter, a metal plate was attached as a weight at the edge of the other side in the TD direction so that a uniform tension was applied to the entire PET film. At this time, the weight of the metal plate was adjusted so that a tension of 20 gf/cm$^2$ was applied. A support was obtained by preheating treatment under the air atmosphere and normal pressure while applying tension under the heating temperature and the heating time of the preheating condition 1 in Table 1.

(2) Preparation of Resin Varnish A 30 parts of a biphenyl type epoxy resin (epoxy equivalent about 290, "NC3000H", manufactured by Nippon Kayaku Co., Ltd.), 5 parts of a naphthalene type tetrafunctional epoxy resin (epoxy equivalent 162, "HP-4700", manufactured by DIC Corporation), 15 parts of a liquid bisphenol A type epoxy resin (epoxy equivalent 180, "jER828EL", manufactured by Mitsubishi Chemical Corporation), and 2 parts of phenoxy resin (weight average molecular weight 35000, "YX7553BH30", manufactured by Mitsubishi Chemical Corporation, a methyl ethyl ketone (MEK) solution having a nonvolatile component of 30% by mass) were heated and dissolved in a mixed solvent of 8 parts of MEK and 8 parts of cyclohexanone with stirring. To this solution, 32 parts of a triazine skeleton-containing phenol novolak-based curing agent (phenolic hydroxyl equivalent about 124, "LA-7054", manufactured by DIC Corporation, a MEK solution having a nonvolatile component of 60% by mass), 0.2 parts of a phosphorus-based curing accelerator ("TBP-DA", manufactured by Hokko Chemical Industry Co., Ltd., tetrabutylphosphonium decanoate), 160 parts of spherical silica ("SOC2", manufactured by Admatechs Company Limited, average particle diameter 0.5 µm) with its surface treated with an aminosilane coupling agent ("KBM573", manufactured by Shin-Etsu Chemical Co., Ltd.), and 2 parts of a polyvinyl butyral resin solution (weight average molecular weight 27000, glass transition temperature 105° C., "KS-1", manufactured by Sekisui Chemical Co., Ltd., a mixed solution containing ethanol and toluene in a mass ratio of 1:1 and having a nonvolatile component of 15% by mass) were mixed and uniformly dispersed in a high-speed rotation mixer to prepare a resin varnish A. The content of the inorganic filler (spherical silica) was 69.4% by mass when the total mass of the nonvolatile components in the resin varnish A was determined to be 100% by mass.

(3) Preparation of Adhesive Sheet

The resin varnish A prepared in the (2) was uniformly applied onto the releasing layer of the support prepared in the (1) using a die coater, and the applied varnish was dried at 80° C. to 120° C. (in average 100° C.) for 6 minutes to form a resin composition layer bonded to the support. The thickness of the obtained resin composition layer was 40 µm and the residual solvent amount was about 2% by mass. Subsequently, the resin composition layer was wound into a roll while laminating the resin composition layer with a polypropylene film as a protection film (thickness 15 µm). The obtained roll-form adhesive sheet was slit to a width of 507 mm to produce an adhesive sheet having a size of 507 mm×336 mm.

Example 2

The support and the adhesive sheet were prepared in a similar manner to Example 1 except that a resin varnish B was prepared as described below.

(1) Preparation of Resin Varnish B 28 parts of a liquid bisphenol A type epoxy resin (epoxy equivalent 180, "jER828EL", manufactured by Mitsubishi Chemical Corporation) and 28 parts of a naphthalene type tetrafunctional epoxy resin (epoxy equivalent 163, "HP-4700", manufactured by DIC Corporation) were heated and dissolved in a mixed solvent of 15 parts of methyl ethyl ketone (MEK) and 15 parts of cyclohexanone with stirring. To this solution, 110 parts of a naphthol type curing agent having a novolac structure (phenolic hydroxy group equivalent 215, "SN-485", manufactured by NIPPON STEEL & SUMIKIN CHEMICAL CO., LTD., a MEK solution having a nonvolatile component of 50%), 0.1 parts of a curing accelerator ("2E4MZ", manufactured by SHIKOKU CHEMICALS CORPORATION), 70 parts of spherical silica ("SOC2" manufactured by Admatechs Company Limited, average particle diameter of 0.5 µm), and 35 parts of a polyvinyl butyral resin solution ("KS-1", manufactured by Sekisui Chemical Co., Ltd., a mixed solution containing ethanol and toluene in a mass ratio of 1:1 and having a nonvolatile component of 15%) were mixed and uniformly dispersed in a high-speed rotation mixer to prepare a resin varnish B. The content of the inorganic filler in the resin varnish B was 38% by mass when the total mass of the nonvolatile components in the resin varnish B was determined to be 100% by mass. (Total number of epoxy groups of epoxy resi):(Total number of reactive groups of curing agent) was 1:0.78.

Example 3

The support and the adhesive sheet were prepared in a similar manner to Example 1 except that the release PET film was preheated under tension under the conditions of the preheating condition 2 in Table 1.

Example 4

The support and the adhesive sheet were prepared in a similar manner to Example 2 except that the release PET film was preheated under tension under the conditions of the preheating condition 2 in Table 1.

Example 5

The support and the adhesive sheet were prepared in a similar manner to Example 1 except that the release PET film was preheated under tension under the conditions of the preheating condition 3 in Table 1.

Example 6

The support and the adhesive sheet were prepared in a similar manner to Example 2 except that the release PET film was preheated under tension under the conditions of the preheating condition 3 in Table 1.

Example 7

The support and the adhesive sheet were prepared in a similar manner to Example 1 except that the release PET film was preheated under tension under the conditions of the preheating condition 5 in Table 1.

Example 8

The support and the adhesive sheet were prepared in a similar manner to Example 2 except that the release PET film was preheated under tension under the conditions of the preheating condition 5 in Table 1.

Example 9

The support and the adhesive sheet were prepared in a similar manner to Example 1 except that the release PET film was preheated under tension under the conditions of the preheating condition 6 in Table 1.

Example 10

The support and the adhesive sheet were prepared in a similar manner to Example 2 except that the release PET film was preheated under tension under the conditions of the preheating condition 6 in Table 1.

Comparative Example 1

The support and the adhesive sheet were prepared in a similar manner to Example 1 except that the release PET film was used as the support without preheating treatment.

Comparative Example 2

The support and the adhesive sheet were prepared in a similar manner to Example 2 except that the release PET film was used as the support without preheating treatment.

Comparative Example 3

The support and the adhesive sheet were prepared in a similar manner to Example 1 except that the release PET film was preheated under tension under the conditions of the preheating condition 4 in Table 1.

Comparative Example 4

The support and the adhesive sheet were prepared in a similar manner to Example 2 except that the release PET film was preheated under tension under the conditions of the preheating condition 4 in Table 1.

The expansion coefficient of the support, the temperature relating to the expansion coefficient, and the minimum melt viscosity of the resin composition layer according to Examples described above are listed in Table 2. The measurement of the height of the highest point of the raised part and evaluation of the insulating layer in the vicinity of the end part of the support are listed in Table 3 and Table 5. Evaluation of wrinkle and lifting of the support and evaluation of the resin chip adhesion are listed in Table 3 and Table 5.

TABLE 2

| | | Examples | | | | | | | | | |
|---|---|---|---|---|---|---|---|---|---|---|---|
| | | 1 | 2 | 3 | 4 | 5 | 6 | 7 | 8 | 9 | 10 |
| Resin composition layer | Resin varnish | A | B | A | B | A | B | A | B | A | B |
| | Thickness (μm) | 40 | 40 | 40 | 40 | 40 | 40 | 40 | 40 | 40 | 40 |
| | Minimum melt viscosity(poise) | 3400 | 4000 | 3400 | 4000 | 3400 | 4000 | 3400 | 4000 | 3400 | 4000 |
| | Minimum melt viscosity when expansion coefficient of support in TD direction is 0 (%) or less(poise) | 3600 | 3900 | 3600 | 3900 | 10000 | 10000 | 3600 | 3900 | 3600 | 3900 |
| | Minimum melt viscosity when expansion coefficient of support in MD direction is 0 (%) or less(poise) | 3600 | 3900 | 3600 | 3900 | 3600 | 3900 | 3800 | 3900 | 3600 | 3900 |
| Support | Maximum expansion coefficient $E_{TD}$(%) in TD direction at 100° C. or more | −0.23 | −0.23 | −0.05 | −0.05 | 0.19 | 0.19 | 0.15 | 0.15 | 0.07 | 0.07 |
| | Maximum expansion coefficient $E_{MD}$(%) in MD direction at 100° C. or more | −0.35 | −0.35 | −0.31 | −0.31 | 0.1 | 0.1 | 0.09 | 0.09 | −0.08 | −0.08 |
| | Maximum expansion coefficient $E_{TD}$(%) in TD direction at 120° C. or more | −0.28 | −0.28 | −0.07 | −0.07 | 0.02 | 0.02 | 0.11 | 0.11 | −0.08 | −0.08 |
| | Maximum expansion coefficient $E_{MD}$(%) in MD direction at 120° C. or more | −0.41 | −0.41 | −0.33 | −0.33 | −0.18 | −0.18 | 0.02 | 0.02 | −0.14 | −0.14 |
| | Temperature at which expansion coefficient in TD direction becomes maximum (° C.) | 70 | 70 | 80 | 80 | 85 | 85 | 115 | 115 | 90 | 90 |
| | Temperature at which expansion coefficient in MD direction becomes maximum (° C.) | 75 | 75 | 75 | 75 | 70 | 70 | 85 | 85 | 80 | 80 |
| | Temperature $T_{TD}$ at which expansion coefficient in TD direction becomes 0(%) (° C.) | 85 | 85 | 90 | 90 | 165 | 165 | 130 | 130 | 105 | 105 |
| | Temperature $T_{MD}$ at which expansion coefficient in MD direction becomes 0(%) (° C.) | 95 | 95 | 90 | 90 | 90 | 90 | 125 | 125 | 95 | 95 |

TABLE 3

|  |  |  | Examples | | | | | | | | | |
|---|---|---|---|---|---|---|---|---|---|---|---|---|
|  |  |  | 1 | 2 | 3 | 4 | 5 | 6 | 7 | 8 | 9 | 10 |
| Evaluation result | TD direction | Evaluation board A: height of highest point of raised part(μm) | 64 | 49 | 61 | 67 | 53 | 71 | 68 | 72 | 59 | 65 |
|  |  | Evaluation board B: height of highest point of raised part(μm) | 81 | 90 | 75 | 86 | 126 | 130 | 84 | 89 | 81 | 87 |
|  |  | Evaluation of insulating layer in the vicinity of edge part of support | ○ | ○ | ○ | ○ | ○ | ○ | ○ | ○ | ○ | ○ |
|  | MD direction | Evaluation board A: height of highest point of raised part(μm) | 58 | 43 | 54 | 48 | 37 | 67 | 42 | 51 | 55 | 48 |
|  |  | Evaluation board B: height of highest point of raised part(μm) | 78 | 84 | 83 | 80 | 87 | 86 | 88 | 83 | 84 | 88 |
|  |  | Evaluation of insulating layer in the vicinity of edge part of support | ○ | ○ | ○ | ○ | ○ | ○ | ○ | ○ | ○ | ○ |
|  |  | Winkles and lifting of support | ○ | ○ | ○ | ○ | ○ | ○ | ○ | ○ | ○ | ○ |
|  |  | Resin chip adhesion | ○ | ○ | ○ | ○ | ○ | ○ | ○ | ○ | ○ | ○ |

The expansion coefficient of the support, the temperature relating to the expansion coefficient, and the minimum melt viscosity of the resin composition layer (resin composition) according to Comparative Examples are listed in Table 4. The measurement of the height of the highest point of the raised part and evaluation of the insulating layer in the vicinity of the end part of the support are listed in Table 5. In Table 4, the sign "–" means that the minimum melt viscosity was not able to be measured or the expansion coefficient did not have a negative value.

TABLE 4

|  |  | Comparative Example | | | |
|---|---|---|---|---|---|
|  |  | 1 | 2 | 3 | 4 |
| Resin composition layer | Resin varnish | A | B | A | A |
|  | Thickness (μm) | 40 | 40 | 40 | 40 |
|  | Minimum melt viscosity (poise) | 3400 | 4000 | 3400 | 4000 |
|  | Minimum melt viscosity when expansion coefficient of support in TD direction is 0 (%) or less (poise) | — | — | 40000 | 70000 |
|  | Minimum melt viscosity when expansion coefficient of support in MD direction is 0 (%) or less (poise) | 3700 | 3900 | 3600 | 3900 |
| Support | Maximum expansion coefficient $E_{TD}$ (%) in TD direction at 100° C. or more | 1.1 | 1.1 | 0.58 | 0.58 |
|  | Maximum expansion coefficient $E_{MD}$ (%) in MD direction at 100° C. or more | −0.2 | −0.2 | −0.15 | −0.15 |
|  | Maximum expansion coefficient $E_{TD}$ (%) in TD direction at 120° C. or more | 1.1 | 1.1 | 0.58 | 0.58 |
|  | Maximum expansion coefficient $E_{MD}$ (%) in MD direction at 120° C. or more | −0.25 | −0.25 | −0.2 | −0.2 |
|  | Temperature at which expansion coefficient in TD direction becomes maximum (° C.) | 170 | 170 | 165 | 165 |
|  | Temperature at which expansion coefficient in MD direction becomes maximum (° C.) | 85 | 85 | 85 | 85 |
|  | Temperature $T_{TD}$ at which expansion coefficient in TD direction becomes 0 (%) (° C.) | — | — | 180 | 180 |
|  | Temperature $T_{MD}$ at which expansion coefficient in MD direction becomes 0 (%) (° C.) | 95 | 95 | 85 | 85 |

TABLE 5

|  |  |  | Comparative Example | | | |
|---|---|---|---|---|---|---|
|  |  |  | 1 | 2 | 3 | 4 |
| Evaluation result | TD direction | Evaluation board A; height of highest point of raised part (μm) | 170 | 145 | 135 | 129 |
|  |  | Evaluation board B height of highest point of raised part (μm) | 192 | 165 | 175 | 163 |
|  |  | Evaluation of insulating layer in the vicinity of edge part of support | x | x | x | x |

TABLE 5-continued

|  |  | Comparative Example | | | |
|---|---|---|---|---|---|
|  |  | 1 | 2 | 3 | 4 |
| MD direction | Evaluation board A: height of highest point of raised part (μm) | 54 | 42 | 57 | 46 |
|  | Evaluation board B: height of highest point of raised part (μm) | 81 | 76 | 84 | 82 |
|  | Evaluation of insulating layer in the vicinity of edge part of support | ○ | ○ | ○ | ○ |
|  | Winkles and lifting of support | x | x | x | x |
|  | Resin chip adhesion | x | x | x | x |

As is clear from the above description, in Examples 1 to 10, the height of the highest point of the raised part at the end part side in the TD direction was reduced compared with Comparative Examples 1 to 4, and thus the insulating layer was prevented from running on the support. In other words, the flatness of the insulating layer was improved in Examples 1 to 10.

Where a numerical limit or range is stated herein, the endpoints are included. Also, all values and subranges within a numerical limit or range are specifically included as if explicitly written out.

As used herein the words "a" and "an" and the like carry the meaning of "one or more."

Obviously, numerous modifications and variations of the present invention are possible in light of the above teachings. It is therefore to be understood that, within the scope of the appended claims, the invention may be practiced otherwise than as specifically described herein.

All patents and other references mentioned above are incorporated in full herein by this reference, the same as if set forth at length.

The invention claimed is:

1. A method for manufacturing a printed wiring board, comprising:
   (A) laminating an adhesive sheet comprising a support and a resin composition layer bonded to said support to an inner layer board so that said resin composition layer is bonded to said inner layer board;
   (B) thermally curing said resin composition layer to form an insulating layer; and
   (C) removing said support,
   in this order, wherein
   said support satisfies a condition (MD1) and a condition (TD1) below when being heated under heating conditions below:
   Heating conditions: temperature is raised from 20° C. to 100° C. at a rate of temperature rise of 8° C./min and heating is carried out at 100° C. for 30 minutes, and thereafter the temperature is raised to 180° C. at a rate of temperature rise of 8° C./min and heating is carried out at 180° C. for 30 minutes,
   Condition (MD1): a maximum expansion coefficient $E_{MD}$ (%) in an MD direction at 120° C. or more is less than 0.2%, and
   Condition (TD1): a maximum expansion coefficient $E_{TD}$ (%) in a TD direction at 120° C. or more is less than 0.2%.

2. The method according to claim 1, wherein said support satisfies a condition (MD2) and a condition (TD2) below:
   Condition (MD2): the maximum expansion coefficient $E_{MD}$ (%) in the MD direction at 100° C. or more is less than 0%, and
   Condition (TD2): the maximum expansion coefficient $E_{TD}$ (%) in the TD direction at 100° C. or more is less than 0%.

3. The method according to claim 1, wherein Step (B) comprises:
   (i) heating said resin composition layer at a temperature $T_1$ (50° C. ≤ $T_1$ < 150° C.) and;
   (ii) thermally curing said resin composition layer at a temperature $T_2$ (150° C. ≤ $T_2$ ≤ 240° C.) after said (i) heating.

4. The method according to claim 1, wherein
   under said heating conditions, a minimum melt viscosity of said resin composition layer when the expansion coefficient of the support in the TD direction is 0(%) or less is 10,000 poise or less, and a minimum melt viscosity of said resin composition layer when the expansion coefficient of the support in the MD direction is 0(%) or less is 10,000 poise or less.

5. A method for manufacturing a printed wiring board, comprising:
   (A) laminating an adhesive sheet comprising a support and a resin composition layer bonded to said support to an inner layer board so that said resin composition layer is bonded to said inner layer board;
   (B) thermally curing said resin composition layer to form an insulating layer; and
   (C) removing said support,
   in this order, wherein
   said support satisfies a condition (MD3) and a condition (TD3) below when being heated under heating conditions below:
   Heating conditions: temperature is raised from 20° C. to 100° C. at a rate of temperature rise of 8° C./min and heating is carried out at 100° C. for 30 minutes, and thereafter the temperature is raised to 180° C. at a rate of temperature rise of 8° C./min and heating is carried out at 180° C. for 30 minutes,
   Condition (MD3): a temperature at which an expansion coefficient in an MD direction becomes maximum is less than 120° C., and
   Condition (TD3): a temperature at which an expansion coefficient in a TD direction becomes maximum is less than 120° C.

6. A method for manufacturing a printed wiring board, comprising:
   (A) laminating an adhesive sheet comprising a support and a resin composition layer bonded to said support to an inner layer board so that said resin composition layer is bonded to said inner layer board;

(B) thermally curing said resin composition layer to form an insulating layer; and
(C) removing said support,
in this order, wherein
in said (B) thermally curing, a condition (MD4) and a condition (TD4) below are satisfied:
Condition (MD4): a temperature at which an expansion coefficient of the support in an MD direction becomes maximum is less than 120° C., and
Condition (TD4): a temperature at which an expansion coefficient of the support in a TD direction becomes maximum is less than 120° C.

* * * * *